(12) United States Patent
Takeshita et al.

(10) Patent No.: US 7,763,412 B2
(45) Date of Patent: Jul. 27, 2010

(54) POLYMER, POSITIVE RESIST COMPOSITION AND METHOD FOR FORMING RESIST PATTERN

(75) Inventors: Masaru Takeshita, Kawasaki (JP); Hideo Hada, Kawasaki (JP); Ryotaro Hayashi, Kawasaki (JP); Takeshi Iwai, Kawasaki (JP); Syogo Matsumaru, Kawasaki (JP); Satoshi Fujimura, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 346 days.

(21) Appl. No.: 11/628,172

(22) PCT Filed: Jun. 2, 2005

(86) PCT No.: PCT/JP2005/010135

§ 371 (c)(1),
(2), (4) Date: Nov. 30, 2006

(87) PCT Pub. No.: WO2005/121193

PCT Pub. Date: Dec. 22, 2005

(65) Prior Publication Data

US 2008/0063975 A1    Mar. 13, 2008

(30) Foreign Application Priority Data

Jun. 8, 2004 (JP) .................... P2004-169589
Jun. 8, 2004 (JP) .................... P2004-169590

(51) Int. Cl.
G03F 7/039 (2006.01)
G03F 7/20 (2006.01)
G03F 7/30 (2006.01)

(52) U.S. Cl. .............. 430/270.1; 430/910; 430/326; 430/907; 430/921; 430/925

(58) Field of Classification Search ............... None
See application file for complete search history.

(56) References Cited

U.S. PATENT DOCUMENTS 5,968,713 A    10/1999    Nozaki et al.
6,004,720 A    12/1999    Takechi et al.

(Continued)

FOREIGN PATENT DOCUMENTS

EP    1 452 917 A1    9/2004

(Continued)

OTHER PUBLICATIONS

Office Action issued in counterpart Japanese Patent Application No. 2004-169590, dated May 19, 2009.

Office Action issued in related Japanese Patent Application No. 2004-169589, dated Mar. 9, 2010.

Primary Examiner—Sin J. Lee
(74) Attorney, Agent, or Firm—Knobbe, Martens, Olson & Bear, LLP

(57) ABSTRACT

A polymer, a positive resist composition, and a method for forming a resist pattern that are able to form a resist pattern with a high level of resolution and excellent etching resistance. The present invention uses a polymer that contains a structural unit (a1) represented by a general formula (a-1) shown below and a structural unit (a2) represented by a general formula (a-2) shown below, another polymer that contains the structural unit (a1) and a structural unit (a3) represented by a general formula (a-3) shown below, and another polymer that contains the structural unit (a1), the structural unit (a2), and the structural unit (a3).

[Formula 1]

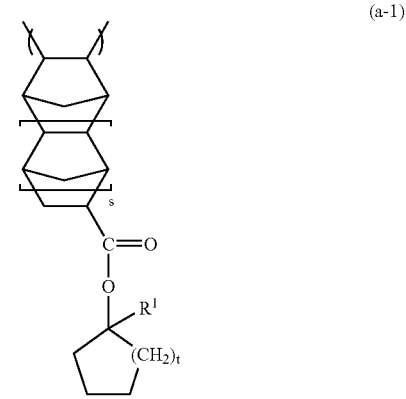

(a-1)

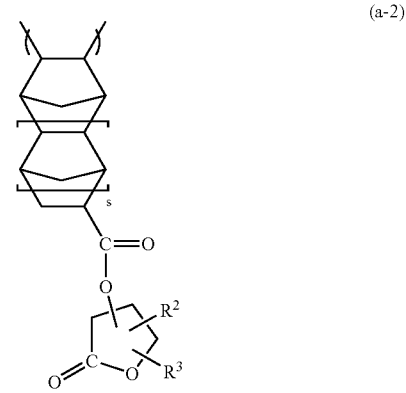

(a-2)

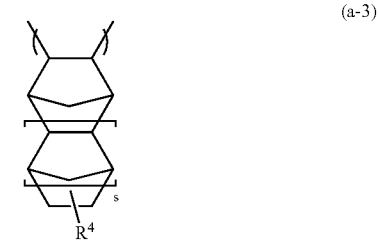

(a-3)

16 Claims, No Drawings

U.S. PATENT DOCUMENTS

| | | | |
|---|---|---|---|
| 6,165,678 | A | 12/2000 | Allen et al. |
| 6,214,517 | B1 | 4/2001 | Sato et al. |
| 6,280,898 | B1 | 8/2001 | Hasegawa et al. |
| 6,291,129 | B1 | 9/2001 | Shida et al. |
| 6,306,554 | B1 | 10/2001 | Barclay et al. |
| 6,329,125 | B2 | 12/2001 | Takechi et al. |
| 6,579,658 | B2 | 6/2003 | Hatakeyama et al. |
| 6,656,659 | B1 | 12/2003 | Nozaki et al. |
| 6,673,511 | B1 | 1/2004 | Hatakeyama et al. |
| 6,887,644 | B1 | 5/2005 | Nozaki et al. |
| 7,435,530 | B2 | 10/2008 | Iwai et al. |
| 2002/0006576 | A1 | 1/2002 | Sato et al. |
| 2002/0055649 | A1 | 5/2002 | Miyagi et al. |
| 2002/0068238 | A1 | 6/2002 | Hada et al. |
| 2002/0098443 | A1 | 7/2002 | Hatakeyama et al. |
| 2002/0193622 | A1 | 12/2002 | Watanabe et al. |
| 2003/0077543 | A1 | 4/2003 | Sato |
| 2003/0099901 | A1 | 5/2003 | Hatakeyama et al. |
| 2003/0224288 | A1 * | 12/2003 | Kodama ............ 430/270.1 |
| 2003/0232270 | A1 | 12/2003 | Chen et al. |
| 2004/0076903 | A1 | 4/2004 | Li et al. |
| 2004/0229157 | A1 * | 11/2004 | Rhodes et al. ........ 430/270.1 |
| 2005/0095527 | A1 | 5/2005 | Yokoyama et al. |
| 2006/0074139 | A1 | 4/2006 | Ishii et al. |
| 2008/0020321 | A1 | 1/2008 | Kohno et al. |
| 2008/0063975 | A1 | 3/2008 | Takeshita et al. |

FOREIGN PATENT DOCUMENTS

| | | |
|---|---|---|
| EP | 1 452 918 A1 | 9/2004 |
| EP | 1 452 919 | 9/2004 |
| EP | 1 452 919 A1 | 9/2004 |
| EP | 1 517 179 A1 * | 3/2005 |
| EP | 1 596 251 A1 | 11/2005 |
| EP | 1 643 306 A1 | 4/2006 |
| JP | 04-039665 | 2/1992 |
| JP | H05-346668 | 12/1993 |
| JP | H07-234511 | 9/1995 |
| JP | H09-073173 | 3/1997 |
| JP | H09-090637 | 4/1997 |
| JP | H10-161313 | 6/1998 |
| JP | H10-319595 | 12/1998 |
| JP | H11-012326 | 1/1999 |
| JP | 2000-235263 | 8/2000 |
| JP | A-2000-292917 | 10/2000 |
| JP | 2001-194776 | 7/2001 |
| JP | A-2002-138067 | 5/2002 |
| JP | A-2003-043689 | 2/2003 |
| JP | 2003-066626 | 3/2003 |
| JP | 2003-167347 | 6/2003 |
| JP | 2003-177538 | 6/2003 |
| JP | 2003-223001 | 8/2003 |
| JP | 2003-238629 | 8/2003 |
| JP | 2003-280201 | 10/2003 |
| JP | 2003-335826 | 11/2003 |
| JP | 2003-345025 | 12/2003 |
| JP | 2004-133055 | 4/2004 |
| JP | 2004-176049 | 6/2004 |
| JP | 2004-300403 | 10/2004 |
| JP | 2005-298517 | 10/2005 |
| JP | 2005-316136 | 11/2005 |
| WO | WO 02/084402 A2 | 10/2002 |
| WO | WO 2004/041879 A1 | 5/2004 |

* cited by examiner

POLYMER, POSITIVE RESIST COMPOSITION AND METHOD FOR FORMING RESIST PATTERN

RELATED APPLICATIONS

This application is the U.S. National Phase filing under 35 U.S.C. §371 of PCT/JP2005/010135, filed Jun. 2, 2005, which designated the United States and was published in a language other than English, which claims priority under 35 U.S.C. §119(a)-(d) to Japanese Patent Application Number 2004-169589, filed Jun. 8, 2004, and Japanese Patent Application Number 2004-169590, filed Jun. 8, 2004. The content of these applications is incorporated herein by reference in their entireties.

TECHNICAL FIELD

The present invention relates to a polymer, a positive resist composition, and a method for forming a resist pattern.

BACKGROUND ART

In recent years, in the production of semiconductor elements and liquid crystal display elements, advances in lithography techniques have lead to rapid progress in the field of miniaturization. Typically, these miniaturization techniques involve shortening the wavelength of the exposure light source. Conventionally, ultraviolet radiation typified by g-line and i-line radiation has been used, but nowadays KrF excimer lasers (248 nm) are the main light source used in mass production, and ArF excimer lasers (193 nm) are now also starting to be introduced in mass production. Furthermore, research is also being conducted into lithography techniques that use $F_2$ excimer lasers (157 nm), EUV (extreme ultraviolet radiation), and EB (electron beams) and the like as the light source (radiation source).

Resists for use with these types of short wavelength light sources require a high resolution capable of reproducing patterns of minute dimensions, and a high level of sensitivity relative to these types of short wavelength light sources. One example of a known resist that satisfies these conditions is a chemically amplified resist, which includes a base resin and an acid generator (hereafter referred to as a PAG) that generates acid on exposure, and these chemically amplified resists include positive resists in which the alkali solubility of the exposed portions increases, and negative resists in which the alkali solubility of the exposed portions decreases.

Until recently, polyhydroxystyrene (PHS) or derivative resins thereof in which the hydroxyl groups have been protected with acid-dissociable, dissolution-inhibiting groups (PHS-based resins), which exhibit high transparency relative to a KrF excimer laser (248 nm), have been used as the base resin component of chemically amplified resists. However, because PHS-based resins contain aromatic rings such as benzene rings, their transparency is inadequate for light with wavelengths than shorter than 248 nm, such as light of 193 nm. Accordingly, chemically amplified resists that use a PHS-based resin as the base resin component suffer from low levels of resolution in processes that use light of 193 nm.

As a result, resins that contain structural units derived from (meth)acrylate esters within the principal chain (acrylic resins) are now widely used as base resins for resists that use ArF excimer laser lithography, as they offer excellent transparency in the vicinity of 193 nm.

However, compared with conventional base resins such as the PHS-based resins described above, acrylic resins tend to suffer from inferior etching resistance because of their structure. As a result, various problems may arise, including the development of surface roughness on the resist film surface when dry etching is conducted following resist pattern formation.

Generally, the etching resistance of acrylic resins is improved by techniques such as the use of a polycyclic alicyclic group such as an adamantyl group as a substituent group at the ester portion of the (meth)acrylate ester (for example, see patent reference 1).

However, because replacement of the substituent group has a large effect on the lithography characteristics such as the resolution, optimizing the resin for use as a resist continues to be extremely difficult, and there is also a limit to the level of improvement in etching resistance that can be achieved through replacement of the substituent group.

On the other hand, resins in which the principal chain is formed from polycyclic structural units, such as resins with a polycycloolefin (PCO) skeleton in which the principal chain is formed from structural units derived from polycyclic alicyclic groups such as norbornene, have also been proposed as base resins suitable for use in ArF excimer laser lithography and the like (for example, see patent reference 2). These resins with a PCO skeleton (PCO resins) offer the advantage of exhibiting excellent etching resistance when used as a resist.

However, PCO resins exhibit significantly inferior resolution as compared to acrylic resins. As a result, acrylic resins are most commonly used as the base resins for resists for use with ArF excimer laser lithography.

However, as described above, acrylic resins suffer from reduced etching resistance. Accordingly, a resin that is capable of forming a resist pattern with a high level of resolution and superior etching resistance has been keenly sought as a resin for use within resists.

[Patent Reference 1]
Japanese Patent (Granted) Publication No. 2,881,969
[Patent Reference 2]
Japanese Unexamined Patent Application, First Publication No. 2000-235263

DISCLOSURE OF INVENTION

Problems to be Solved by the Invention

The present invention addresses the circumstances described above, with an object of providing a polymer, a positive resist composition, and a method for forming a resist pattern that are capable of forming a resist pattern with a high level of resolution and excellent pattern shape and etching resistance.

Means for Solving the Problems

As a result of intensive investigation, the inventors of the present invention discovered that by using a polymer containing two or three specific structural units, and a positive resist composition that comprises the polymer, or a positive resist composition that employs a mixture of two specific polymers as the base resin, the above object could be achieved, and, thus, they completed the present invention.

In other words, the present invention adopts the aspects described below.

First aspect: A polymer (hereafter referred to as the polymer (A1)), containing a structural unit (a1) represented by a general formula (a-1) shown below, and a structural unit (a2) represented by a general formula (a-2) shown below.

Second aspect: A polymer (hereafter referred to as the polymer (A2)), containing a structural unit (a1) represented by the general formula (a-1) shown below, and a structural unit (a3) represented by a general formula (a-3) shown below.

Third aspect: A polymer (hereafter referred to as the polymer (A3)), containing a structural unit (a1) represented by the general formula (a-1) shown below, a structural unit (a2) represented by the general formula (a-2) shown below, and a structural unit (a3) represented by the general formula (a-3) shown below.

Fourth aspect: A positive resist composition, including either one, or two or more of the above polymers (A1) to (A3), and a compound (B) that generates acid on irradiation.

Fifth aspect: A positive resist composition, comprising a resin (A') that contains acid-dissociable, dissolution-inhibiting groups and exhibits increased alkali solubility under the action of acid, and a compound (B) that generates acid on irradiation, wherein the resin (A') is a mixture of a cyclic group-containing principal chain polymer (A'1), and a polymer (A'2) containing solely structural units (a') derived from a (meth)acrylate esters and/or (meth)acrylic acid.

Sixth aspect: A method for forming a resist pattern, including the steps of applying an aforementioned positive resist composition to a support, conducting selective exposure, and subsequently conducting alkali developing to form the resist pattern.

[Formula 1]

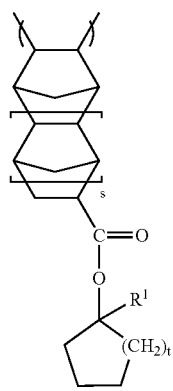

(a-1)

[In the formula (a-1), $R^1$ represents an alkyl group of two or more carbon atoms, s represents either 0 or 1, and t represents an integer from 1 to 3.]

[Formula 2]

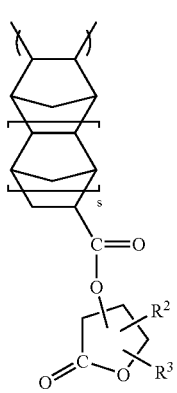

(a-2)

[In the formula (a-2), $R^2$ and $R^3$ each represent, independently, a hydrogen atom or a lower alkyl group, and s represents either 0 or 1.]

[Formula 3]

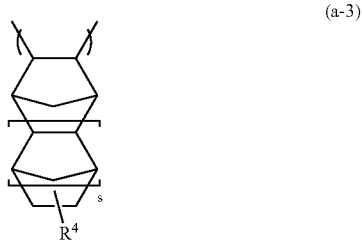

(a-3)

[In the formula (a-3), $R^4$ represents an organic group containing an alkali-soluble group, and s represents either 0 or 1.]

In the present invention, the term "structural unit" refers to a monomer unit that contributes to the formation of a polymer. The term "(meth)acrylate ester" is a generic term that includes methacrylate esters and/or acrylate esters. The term "(meth)acrylic acid" is a generic term that includes methacrylic acid and/or acrylic acid. The term "structural unit derived from a (meth)acrylate ester and/or (meth)acrylic acid" refers to a structural unit that is formed by the cleavage of the ethylenic double bond of a (meth)acrylate ester and/or (meth)acrylic acid.

Furthermore, the term "exposure" is used as a general concept that includes irradiation with any form of radiation.

EFFECTS OF THE INVENTION

According to the present invention, a polymer and a positive resist composition are provided that are capable of forming a resist pattern with a high level of resolution and excellent etching resistance.

BEST MODE FOR CARRYING OUT THE INVENTION

As follows is a more detailed description of the present invention.

<<Polymer>>

In the present invention, all of the polymers (A1), (A2), and (A3) contain, within the principal chain, structural units represented by a general formula shown below:

[Formula 4]

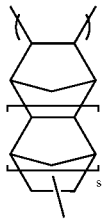

[wherein s represents either 0 or 1], namely, structural units derived from a polycyclic olefin (hereafter referred to as a polycycloolefin) such as bicyclo[2.2.1]-2-heptene(norbornene) or tetracyclo[$4.4.0.1^{2,5}.1^{7,10}$]-3-dodecene, and exhibit excellent etching resistance as resists. It is presumed that this observation is a result of an increase in carbon density provided by these structures.

<First Aspect>

A polymer (A1) of the first aspect of the present invention contains, as essential structural units, a structural unit (a1) represented by the general formula (a-1) shown above, and a structural unit (a2) represented by the general formula (a-2) shown above.

[Structural Unit (a1)]

The structural unit (a1) represented by the general formula (a-1) is a structural unit derived from a polycycloolefin, and includes a 1-alkyl (the group $R^1$ in the formula (a-1), containing two or more carbon atoms)-1-cycloalkyl (5 to 8 carbon atoms)-oxycarbonyl group as a substituent group at either position 5 (in the case where s=0) or position 8 (in the case where s=1) of the ring structure.

The 1-alkyl-1-cycloalkyl group portion of this substituent group is an acid-dissociable, dissolution-inhibiting group, and by ensuring there are two or more carbon atoms within the alkyl group of the 1-alkyl portion, the acid-dissociable, dissolution-inhibiting group is more readily dissociable than the case in which, for example, the alkyl group is a methyl group. It is thought that this increased acid dissociability contributes to the resolution improvement effect observed for the present invention.

Furthermore, because the structural unit contains a cycloalkyl group, which is a monocyclic alicyclic group, the hydrophobicity of the polymer (A1) is lower (the hydrophilicity is higher) than the case in which the acid-dissociable, dissolution-inhibiting group incorporates a polycyclic group such as an adamantyl group, and it is presumed that as a result, when the polymer (A1) is used within a resist composition, the affinity between the resist film produced using the resist composition and the alkali developing solution is enhanced, thereby improving the resolution of the resulting resist pattern.

Furthermore, compared with the case in which the acid-dissociable, dissolution-inhibiting group has a structure that contains no cyclic groups, such as a chain-like tertiary alkyl group, the etching resistance of the resist pattern is improved.

In the formula (a-1), $R^1$ is an alkyl group of two or more carbon atoms, and may be either a straight-chain or a branched group, although lower alkyl groups of 2 to 5 carbon atoms are preferred, and suitable examples include an ethyl group, propyl group, isopropyl group, n-butyl group, isobutyl group, pentyl group, isopentyl group, and neopentyl group. An ethyl group is preferred.

s represents either 0 or 1, but is most preferably 0.

t represents an integer from 1 to 3, but is preferably 2 from the viewpoint of industrial availability.

As the structural unit (a1), either a single type of structural unit may be used alone, or a combination of two or more different structural units may be used.

Within a polymer (A1) of the present invention, the proportion of the structural unit (a1), relative to the combined total of all the structural units that constitute the resist composition polymer of the present invention, is preferably within a range of from 10 to 80 mol %, and even more preferably from 30 to 60 mol %. Ensuring that this proportion is at least as large as the lower limit of the above range enables a more favorable pattern to be obtained when the polymer is used as a resist composition, whereas ensuring that the proportion is no greater than the upper limit enables a more favorable balance to be achieved with the other structural units.

Monomers that give rise to the structural unit (a1) can be synthesized by reacting a 1-alkyl(two or more carbon atoms)-1-cycloalkyl(5 to 8 carbon atoms) (meth)acrylate with either cyclopentadiene or dicyclopentadiene using a conventional Diels-Alder reaction, as disclosed in Japanese Unexamined Patent Application, First Publication No. 2000-235263.

[Structural Unit (a2)]

The structural unit (a2) represented by the general formula (a-2) is a structural unit derived from a polycycloolefin, and includes a group in which one hydrogen atom has been removed from a γ-butyrolactone containing the groups $R^2$ and $R^3$ bonded at either position 5 (in the case where s=0) or position 8 (in the case where s=1) of the ring structure.

In the present invention, the inclusion of the structural unit (a2) improves the resolution. It is presumed that this improvement is a result of an increase in the hydrophilicity of the overall polymer (A1), which means that, when the polymer (A1) is used within a resist composition, the affinity between the resist film produced using the resist composition and the alkali developing solution is enhanced.

In the formula (a-2), s represents the same value as that described above for the formula (a-1).

$R^2$ and $R^3$ each represent, independently, a hydrogen atom or a lower alkyl group, although from the viewpoint of industrial availability, a hydrogen atom is preferred.

The lower alkyl groups represented by $R^2$ and $R^3$ may be either straight-chain or branched groups, although alkyl groups of 1 to 5 carbon atoms are preferred, and suitable examples include a methyl group, ethyl group, propyl group, isopropyl group, n-butyl group, isobutyl group, pentyl group, isopentyl group, and neopentyl group.

As the structural unit (a2), either a single type of structural unit may be used alone, or a combination of two or more different structural units may be used.

Within a polymer (A1) of the present invention, the proportion of the structural unit (a2), relative to the combined total of all the structural units that constitute the polymer (A1), is preferably within a range of from 10 to 80 mol %, and even more preferably from 30 to 60 mol %. Ensuring that this proportion is at least as large as the lower limit of the above range results in superior effects for the present invention, whereas ensuring that the proportion is no greater than the upper limit enables a more favorable balance to be achieved with the other structural units.

In a polymer (A1), the combination of the above structural units (a1) and (a2) preferably accounts for 20 to 90 mol %, and even more preferably from 50 to 80 mol %, of all the structural units that constitute the polymer (A1).

[Structural Unit (a3)]

In addition to the structural units (a1) and (a2) described above, a polymer (A1) of the present invention may also include a structural unit (a3) represented by the general formula (a-3) shown above.

In the formula (a-3), s represents the same value as that described above for the formula (a-1).

Furthermore, $R^4$ represents an organic group that contains an alkali-soluble group.

Examples of the alkali-soluble group within $R^4$ include groups with a similar pKa value to a phenolic hydroxyl group, and specific examples include groups that contain an alkali solubility-imparting group such as an alcoholic hydroxyl group or carboxyl group. In other words, groups with small pKa values (although there are no particular restrictions, groups with a pKa value within a range of from 6 to 12 are ideal).

Because this structural unit includes an alkali-soluble group, it is able to impart a suitable degree of acidity to the polymer (A1), and it is presumed that this enhances the hydrophilicity of the overall polymer (A1), thus contributing to an improvement in the resolution in a similar manner to the aforementioned structural unit (a2). Furthermore, by including the structural unit (a3), the adhesion to substrates improves when the polymer is used as a resist, which can, for example, reduce the occurrence of pattern collapse when a line and space pattern is formed.

More specific examples of the group $R^4$ include alcoholic hydroxyl groups, with no particular restrictions on the bonding position; hydroxyalkyl groups in which the carbon atom at the α-position to the alcoholic hydroxyl group is substituted with an electron-withdrawing group; and carboxyl groups. Of these, a hydroxyalkyl group in which the carbon atom at the α-position to the alcoholic hydroxyl group is substituted with an electron-withdrawing group, or a carboxyl group is preferred.

In the hydroxyalkyl groups in which the carbon atom at the α-position to the alcoholic hydroxyl group is substituted with an electron-withdrawing group, examples of suitable electron-withdrawing groups include halogen atoms and halogenated alkyl groups.

Suitable halogen atoms include a fluorine atom or chlorine atom or the like, although a fluorine atom is preferred.

In a halogenated alkyl group, the halogen may be the same as the above halogen atoms. The alkyl group is preferably a lower alkyl group of about 1 to 3 carbon atoms, even more preferably a methyl group or ethyl group, and is most preferably a methyl group. Specific examples of suitable groups include a trifluoromethyl group, difluoromethyl group, monofluoromethyl group, and perfluoroethyl group, although a trifluoromethyl group is particularly desirable.

The number of electron-withdrawing groups may be either 1 or 2, and is preferably 2.

More specific examples of preferred hydroxyalkyl groups in which the carbon atom at the α-position to the alcoholic hydroxyl group is substituted with an electron-withdrawing group include groups that include a structure represented by a formula —$CR^{31}R^{32}OH$, wherein $R^{31}$ and $R^{32}$ each represent, independently, an alkyl group, halogen atom, or halogenated alkyl group, although at least one of $R^{31}$ and $R^{32}$ represents an electron-withdrawing group selected from amongst halogen atoms and halogenated alkyl groups.

Herein, the halogen atoms and halogenated alkyl groups are the same as those described above, whereas suitable alkyl groups include lower alkyl groups such as a methyl group, ethyl group, and propyl group.

Of these possibilities, groups in which the electron-withdrawing group is a fluorine atom or fluorinated alkyl group are preferred, and groups in which both $R^{31}$ and $R^{32}$ are fluorinated alkyl groups are particularly desirable.

As the group $R^4$, groups represented by a general formula (a-4) shown below are particularly preferred, as they result in superior effects for the present invention, and yield excellent shape for the produced resist pattern.

[Formula 5]

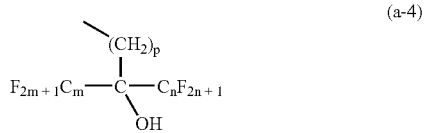

(a-4)

In the formula (a-4), p represents an integer from 1 to 5, and preferably an integer from 1 to 3, and is most preferably 1.

Furthermore, m and n each represent, independently, an integer from 1 to 5, and preferably an integer from 1 to 3, and groups in which both m and n are 1 are particularly desirable from the viewpoint of the ease of synthesis and the effects achieved.

As the structural unit (a3), either a single type of structural unit may be used alone, or a combination of two or more different structural units may be used.

Within a polymer (A1) of the present invention, the proportion of the structural unit (a3), relative to the combined total of all the structural units that constitute the polymer (A1), is preferably within a range of from 5 to 40 mol %, and even more preferably from 10 to 30 mol %. Ensuring that this proportion is at least as large as the lower limit of the above range results in improved resolution and more favorable adhesion to substrates, whereas ensuring that the proportion is no greater than the upper limit enables a more favorable balance to be achieved with the other structural units.

[Other Structural Units (a4)]

The polymer (A1) may also include other structural units (a4) besides the aforementioned structural units (a1) to (a3), provided the inclusion of these other units does not impair the effects of the present invention.

As the structural unit (a4), any other structural unit which cannot be classified as one of the above structural units (a1) through (a3), and which is derived from a monomer that is copolymerizable with the monomers that give rise to the structural units (a1) to (a3) can be used without any particular restrictions.

As the structural unit (a4), any structural unit derived from a conventional compound containing an ethylenic double bond can be used in accordance with the intended purpose of the polymer, although from the viewpoints of achieving superior levels of resolution and resist pattern cross-sectional shape, structural units derived from maleic anhydride, structural units derived from polycycloolefins containing no substituent groups, and structural units derived from polycycloolefins containing a polycyclic alicyclic group as a substituent are particularly preferred. Of these, structural units derived from maleic anhydride are preferred, as they yield favorable adhesion of the resulting resist to substrates. Furthermore, structural units derived from polycycloolefins containing a polycyclic alicyclic group as a substituent are also preferred, as they further improve the etching resistance of the resulting resist.

Examples of structural units derived from polycycloolefins include units derived from bicyclo[2.2.1]-2-heptene (norbornene) and tetracyclo[4.4.0.1$^{2,5}$.1$^{7,10}$]-3-dodecene.

Furthermore, examples of substituent groups that can be borne on these rings include a tricyclodecanyl group, adamantyl group, or tetracyclododecanyl group.

In a polymer (A1), the combination and relative proportions of the structural units (a1) and (a2), and the optional structural units (a3) and (a4), can be selected and adjusted in accordance with the characteristics required.

In those cases where the polymer (A1) is a binary polymer that contains the structural unit (a1) and the structural unit (a2), but does not include the structural unit (a3) (but may include a structural unit (a4)), from the viewpoints of achieving favorable effects for the present invention and enabling more ready control during synthesis of the polymer, the respective proportions (molar ratios) of each of the structural units, relative to the combined total of all the structural units that constitute the polymer (A1), are preferably within a range of from 20 to 80 mol % and even more preferably from 30 to 60 mol % for the structural unit (a1), and preferably within a range of from 20 to 80 mol % and even more preferably from 30 to 60 mol % for the structural unit (a2).

In the case of a ternary polymer that includes the structural unit (a3) in addition to the structural units (a1) and (a2) (and may also include a structural unit (a4)), the respective proportions (molar ratios) of each of the structural units, relative to the combined total of all the structural units that constitute the polymer (A1), are preferably within a range of from 10 to 80 mol %, and even more preferably from 30 to 60 mol % for the structural unit (a1), preferably within a range from 10 to 80 mol %, and even more preferably from 30 to 60 mol % for the structural unit (a2), and preferably within a range from 5 to 40 mol % and even more preferably from 10 to 30 mol % for the structural unit (a3). Such proportions yield superior levels of etching resistance and resolution, and also provide excellent adhesion to substrates and excellent resist pattern shape.

The polymer (A1) can be obtained, for example, by a conventional radical polymerization or the like of the monomers corresponding with each of the structural units, using a radical polymerization initiator such as azobisisobutyronitrile (AIBN).

The weight average molecular weight (the polystyrene equivalent weight average molecular weight determined by gel permeation chromatography, this also applies below) of the polymer (A1) is preferably no higher than 15,000, and is even more preferably 10,000 or lower. Weight average molecular weights of no higher than 15,000 offer various advantages, including excellent etching resistance, resistance to swelling of the resist pattern during developing, and favorable resistance to pattern collapse.

There are no particular restrictions on the lower limit, although from the viewpoints of achieving favorable resolution and favorable solubility in organic solvents, the weight average molecular weight is preferably at least 3,000, and is even more preferably 5,000 or higher.

The polymer (A1) may include either a single polymer or a combination of two or more different polymers.

<Second Aspect>

A polymer (A2) of the second aspect of the present invention contains, as essential structural units, a structural unit (a1) described above, and a structural unit (a3) represented by the general formula (a-3) shown above.

Examples of the structural unit (a1) within the polymer (A2) include the same units as those described above in relation to the structural unit (a1) within the polymer (A1).

Within a polymer (A2) of the present invention, the proportion of the structural unit (a1), relative to the combined total of all the structural units that constitute the resist composition polymer of the present invention, is preferably within a range of from 10 to 80 mol %, and even more preferably from 30 to 60 mol %. Ensuring that this proportion is at least as large as the lower limit of the above range enables a more favorable pattern to be obtained when the polymer is used as a resist composition, whereas ensuring that the proportion is no greater than the upper limit enables a more favorable balance to be achieved with the other structural units.

Examples of the structural unit (a3) within a polymer (A2) include the same units as those described above in relation to the optional structural unit (a3) within the polymer (A1).

Within a polymer (A2) of the present invention, the proportion of the structural unit (a3), relative to the combined total of all the structural units that constitute the polymer (A2), is preferably within a range of from 5 to 40 mol %, and even more preferably from 10 to 30 mol %. Ensuring that this proportion is at least as large as the lower limit of the above range results in superior effects for the present invention, whereas ensuring that the proportion is no greater than the upper limit enables a more favorable balance to be achieved with the other structural units.

In a polymer (A2), the combination of the above structural units (a1) and (a3) preferably accounts for 15 to 80 mol %, and even more preferably from 30 to 60 mol %, of all the structural units that constitute the polymer (A2).

In addition to the structural units (a1) and (a3) described above, the polymer (A2) may also include a structural unit (a2) represented by the general formula (a-2) shown above. Including a structural unit (a2) further improves the resolution.

Examples of the structural unit (a2) include the same units as those described above in relation to the structural unit (a2) within the polymer (A1).

Within a polymer (A2) of the present invention, the proportion of the structural unit (a2), relative to the combined total of all the structural units that constitute the polymer (A2), is preferably within a range of from 10 to 80 mol %, and even more preferably from 30 to 60 mol %. Ensuring that this proportion is at least as large as the lower limit of the above range results in a superior improvement in the resolution, whereas ensuring that the proportion is no greater than the upper limit enables a more favorable balance to be achieved with the other structural units.

In a similar manner to the polymer (A1), the polymer (A2) may also include other structural units (a4) besides the aforementioned structural units (a1) to (a3), provided the inclusion of these other units does not impair the effects of the present invention. Examples of the structural unit (a4) include the same units as those described above.

In the polymer (A2), the combination and relative proportions of the structural units (a1) and (a3), and the optional structural units (a2) and (a4), can be selected and adjusted in accordance with the characteristics required.

In those cases where the polymer (A2) is a binary polymer that contains the structural unit (a1) and the structural unit (a3), but does not include the structural unit (a2) (but may include a structural unit (a4)), from the viewpoints of achieving favorable effects for the present invention and enabling more ready control during synthesis of the polymer, the respective proportions (molar ratios) of each of the structural units, relative to the combined total of all the structural units that constitute the polymer (A2), are preferably within a range of from 10 to 80 mol % and even more preferably from 30 to 60 mol % for the structural unit (a1), and preferably within a range of from 5 to 40 mol % and even more preferably from 10 to 30 mol % for the structural unit (a3).

In the case of a ternary polymer that includes the structural unit (a2) in addition to the structural units (a1) and (a3) (and may also include a structural unit (a4)), the respective proportions (molar ratios) of each of the structural units are the same as those described above for the case in which the polymer (A1) of the first aspect is a ternary polymer.

In a similar manner to the polymer (A1), the polymer (A2) can be obtained by polymerization of the monomers corresponding with each of the structural units.

The weight average molecular weight of the polymer (A2) is the same as that of the polymer (A1).

The polymer (A2) may include either a single polymer or a combination of two or more different polymers.

<Third Aspect>

A polymer (A3) of the third aspect of the present invention contains a structural unit (a1) represented by the above general formula (a-1) above, a structural unit (a2) represented by the above general formula (a-2), and a structural unit (a3) represented by the above general formula (a-3).

Examples of the structural unit (a1) within a polymer (A3) include the same units as those described above in relation to the structural unit (a1) within the polymer (A1).

Within a polymer (A3) of the present invention, the proportion of the structural unit (a1), relative to the combined total of all the structural units that constitute the polymer (A3), is preferably within a range of from 10 to 80 mol %, and even more preferably from 30 to 60 mol %. Ensuring that this proportion is at least as large as the lower limit of the above range enables a more favorable pattern to be obtained when the polymer is used as a resist composition, whereas ensuring that the proportion is no greater than the upper limit enables a more favorable balance to be achieved with the other structural units.

Examples of the structural unit (a2) within a polymer (A3) include the same units as those described above in relation to the structural unit (a2) within the polymer (A1).

Within a polymer (A3) of the present invention, the proportion of the structural unit (a2), relative to the combined total of all the structural units that constitute the polymer (A3), is preferably within a range of from 10 to 80 mol %, and even more preferably from 30 to 60 mol %. Ensuring that this proportion is at least as large as the lower limit of the above range results in superior effects for the present invention, whereas ensuring that the proportion is no greater than the upper limit enables a more favorable balance to be achieved with the other structural units.

Examples of the structural unit (a3) within a polymer (A3) include the same units as those described above in relation to the optional structural unit (a3) within the polymer (A1).

Within a polymer (A3) of the present invention, the proportion of the structural unit (a3), relative to the combined total of all the structural units that constitute the polymer (A3), is preferably within a range of from 5 to 40 mol %, and even more preferably from 10 to 30 mol %. Ensuring that this proportion is at least as large as the lower limit of the above range results in superior effects for the present invention, whereas ensuring that the proportion is no greater than the upper limit enables a more favorable balance to be achieved with the other structural units.

In a polymer (A3), the combination of the above structural units (a1) through (a3) preferably accounts for at least 50 mol %, even more preferably at least 80 mol %, and most preferably 100 mol %, of all the structural units that constitute the polymer (A3).

The respective proportions of each of the structural units (a1) through (a3) within a polymer (A3) are the same as those described above for the case in which the polymer (A1) of the first aspect is a ternary polymer.

Examples of preferred structures for the polymer (A3) include polymers (A11) represented by a general formula (a-11) shown below. These polymers (A11) exhibit excellent resolution and etching resistance, provide excellent adhesion to substrates, are resistant to pattern collapse, and yield resist pattern shapes that exhibit excellent rectangular formability.

[Formula 6]

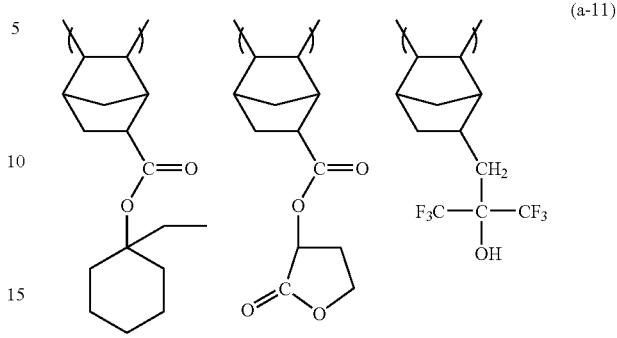

(a-11)

In a similar manner to the polymer (A1), the polymer (A3) can be obtained by polymerization of the monomers corresponding with each of the structural units.

The weight average molecular weight of the polymer (A3) is the same as that of the polymer (A1).

The polymer (A3) may include either a single polymer or a combination of two or more different polymers.

<<Positive Resist Composition>>

<Fourth Aspect>

A positive resist composition of the fourth aspect of the present invention includes an aforementioned polymer of the present invention (hereafter referred to as the component (A)), and a compound that generates acid on irradiation (exposure) (hereafter, this compound is referred to as the component (B)).

Because the component (A) includes structural units (a1) containing so-called acid-dissociable, dissolution-inhibiting groups, the component (A) is insoluble in alkali prior to exposure, but when the acid generated from the component (B) by exposure acts upon the component (A), these acid-dissociable, dissolution-inhibiting groups dissociate, causing the entire component (A) to change from an alkali-insoluble state to an alkali-soluble state. As a result, when the resist is selectively exposed during the formation of a resist pattern, or alternatively, is exposed and then subjected to post exposure baking (PEB), the exposed portions of the resist shift to an alkali-soluble state, whereas the unexposed portions remain insoluble in alkali, meaning that alkali developing can then be used to form a positive resist pattern.

Component (A)

The component (A) is at least one polymer selected from the group consisting of the aforementioned polymers (A1), (A2), and (A3) of the present invention, and any one of these polymers may be used alone, or a combination of two or more polymers may be used.

The quantity of the component (A) within a positive resist composition of the fourth aspect of the present invention can be adjusted in accordance with the film thickness of the resist film that is to be formed. Typically, the quantity of the component (A) is within a range of from 8 to 25% by weight, and preferably from 10 to 20% by weight, in terms of a solid fraction concentration.

Component (B)

The component (B) is a so-called acid generator. In the fourth aspect of the present invention, as the component (B), there can be used any of the known acid generators used in conventional chemically amplified resist compositions without any particular restrictions.

Examples of these acid generators are numerous, and include onium salt-based acid generators such as iodonium salts and sulfonium salts, oxime sulfonate-based acid generators, diazomethane-based acid generators such as bisalkyl or bisaryl sulfonyl diazomethanes, poly(bis-sulfonyl)diazomethanes, and diazomethane nitrobenzyl sulfonates, iminosulfonate-based acid generators, and disulfone-based acid generators.

Specific examples of suitable onium salt-based acid generators include diphenyliodonium trifluoromethanesulfonate or nonafluorobutanesulfonate, bis(4-tert-butylphenyl)iodonium trifluoromethanesulfonate or nonafluorobutanesulfonate, triphenylsulfonium trifluoromethanesulfonate, heptafluoropropanesulfonate or nonafluorobutanesulfonate, tri(4-methylphenyl)sulfonium trifluoromethanesulfonate, heptafluoropropanesulfonate or nonafluorobutanesulfonate, dimethyl(4-hydroxynaphthyl)sulfonium trifluoromethanesulfonate, heptafluoropropanesulfonate or nonafluorobutanesulfonate, monophenyldimethylsulfonium trifluoromethanesulfonate, heptafluoropropanesulfonate or nonafluorobutanesulfonate, diphenylmonomethylsulfonium trifluoromethanesulfonate, heptafluoropropanesulfonate or nonafluorobutanesulfonate, (4-methylphenyl)diphenylsulfonium trifluoromethanesulfonate, heptafluoropropanesulfonate or nonafluorobutanesulfonate, (4-methoxyphenyl)diphenylsulfonium trifluoromethanesulfonate, heptafluoropropanesulfonate or nonafluorobutanesulfonate, and tri(4-tert-butyl)phenylsulfonium trifluoromethanesulfonate, heptafluoropropanesulfonate or nonafluorobutanesulfonate.

Specific examples of suitable oxime sulfonate-based acid generators include α-(methylsulfonyloxyimino)-phenyl acetonitrile, α-(methylsulfonyloxyimino)-p-methoxyphenyl acetonitrile, α-(trifluoromethylsulfonyloxyimino)-phenyl acetonitrile, α-(trifluoromethylsulfonyloxyimino)-p-methoxyphenyl acetonitrile, α-(ethylsulfonyloxyimino)-p-methoxyphenyl acetonitrile, α-(propylsulfonyloxyimino)-p-methylphenyl acetonitrile, and α-(methylsulfonyloxyimino)-p-bromophenyl acetonitrile. Of these, α-(methylsulfonyloxyimino)-p-methoxyphenyl acetonitrile is preferred.

Of the aforementioned diazomethane-based acid generators, specific examples of suitable bisalkyl or bisaryl sulfonyl diazomethanes include bis(isopropylsulfonyl)diazomethane, bis(p-toluenesulfonyl)diazomethane, bis(1,1-dimethylethylsulfonyl)diazomethane, bis(cyclohexylsulfonyl)diazomethane, and bis(2,4-dimethylphenylsulfonyl)diazomethane.

Furthermore, specific examples of poly(bis-sulfonyl)diazomethanes include the structures shown below, such as 1,3-bis(phenylsulfonyldiazomethylsulfonyl)propane (compound A, decomposition point 135° C.), 1,4-bis(phenylsulfonyldiazomethylsulfonyl)butane (compound B, decomposition point 147° C.), 1,6-bis(phenylsulfonyldiazomethylsulfonyl)hexane (compound C, melting point 132° C., decomposition point 145° C.), 1,10-bis(phenylsulfonyldiazomethylsulfonyl)decane (compound D, decomposition point 147° C.), 1,2-bis(cyclohexylsulfonyldiazomethylsulfonyl)ethane (compound E, decomposition point 149° C.), 1,3-bis(cyclohexylsulfonyldiazomethylsulfonyl)propane (compound F, decomposition point 153° C.), 1,6-bis(cyclohexylsulfonyldiazomethylsulfonyl)hexane (compound G, melting point 109° C., decomposition point 122° C.), and 1,10-bis(cyclohexylsulfonyl)decane (compound H, decomposition point 116° C.).

[Formula 7]

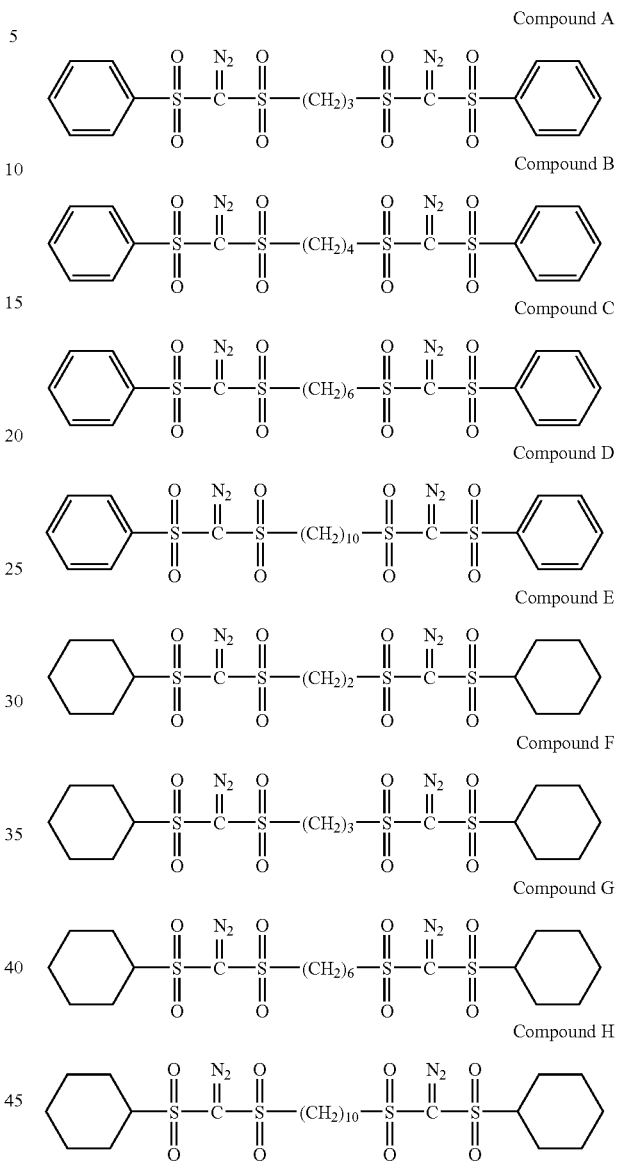

In the fourth aspect of the present invention, of the various possibilities described above, as the component (B), it is preferred to use an onium salt with a fluorinated alkylsulfonate ion as the anion, as such compounds provide superior reactivity with the component (A).

As the component (B), either a single compound may be used alone, or a combination of two or more different compounds may be used.

The quantity used of the component (B) is typically within a range of from 0.5 to 30 parts by weight, and preferably from 1 to 10 parts by weight, per 100 parts by weight of the component (A). By ensuring that the quantity is at least as large as the lower limit of the above range, favorable pattern formation can be achieved, whereas ensuring that the proportion is no greater than the upper limit enables a uniform solution to be obtained, and can prevent deterioration in the storage stability.

Component (D)

In a positive resist composition according to the fourth aspect of the present invention, in order to improve the resist pattern shape and the post exposure stability of the latent image formed by the pattern-wise exposure of the resist layer, a nitrogen-containing organic compound (D) (hereafter referred to as the component (D)) may be added as an optional component.

A multitude of these components (D) have already been proposed, and any of these known compounds may be used, although an amine, and particularly a secondary lower aliphatic amine or tertiary lower aliphatic amine is preferred.

Herein, a lower aliphatic amine refers to an alkyl or alkyl alcohol amine of no more than 5 carbon atoms, and examples of these secondary and tertiary amines include trimethylamine, diethylamine, triethylamine, di-n-propylamine, tri-n-propylamine, tripentylamine, diethanolamine, triethanolamine and triisopropanolamine, and of these, tertiary alkanolamines such as triethanolamine are particularly preferred.

These compounds may be used either alone, or in combinations of two or more different compounds.

The component (D) is typically used in a quantity within a range of from 0.01 to 5.0 parts by weight per 100 parts by weight of the component (A).

Component (E)

Furthermore, in order to prevent any deterioration in sensitivity caused by the addition of the aforementioned component (D), and improve the resist pattern shape and the post exposure stability of the latent image formed by the pattern-wise exposure of the resist layer, an organic carboxylic acid, or a phosphorus oxo acid or derivative thereof (E) may also be added as another optional component (hereafter referred to as the component (E)). The component (D) and the component (E) can be used in combination, or either one can also be used alone.

Examples of suitable organic carboxylic acids include malonic acid, citric acid, malic acid, succinic acid, benzoic acid, and salicylic acid.

Examples of suitable phosphorus oxo acids or derivatives thereof include phosphoric acid or derivatives thereof such as esters, including phosphoric acid, di-n-butyl phosphate, and diphenyl phosphate; phosphonic acid or derivatives thereof such as esters, including phosphonic acid, dimethyl phosphonate, di-n-butyl phosphonate, phenylphosphonic acid, diphenyl phosphonate, and dibenzyl phosphonate; and phosphinic acid or derivatives thereof such as esters, including phosphinic acid and phenylphosphinic acid, and of these, phosphonic acid is particularly preferred.

The component (E) is typically used in a quantity within a range of from 0.01 to 5.0 parts by weight per 100 parts by weight of the component (A).

Other Optional Components

Other miscible additives may also be added to a positive resist composition of the first embodiment of the present invention if desired, and examples include additive resins for improving the properties of the resist film, surfactants for improving the ease of application, dissolution inhibitors, plasticizers, stabilizers, colorants, and halation prevention agents.

Organic Solvent

A positive resist composition according to the present invention can be produced by dissolving the materials in an organic solvent.

The organic solvent may be any solvent capable of dissolving the various components to generate a uniform solution, and one or more solvents selected from known materials used as the solvents for conventional chemically amplified resists can be used.

Specific examples of the solvent include ketones such as γ-butyrolactone, acetone, methyl ethyl ketone, cyclohexanone, methyl isoamyl ketone and 2-heptanone; polyhydric alcohols and derivatives thereof such as ethylene glycol, ethylene glycol monoacetate, diethylene glycol, diethylene glycol monoacetate, propylene glycol, propylene glycol monoacetate, dipropylene glycol, or the monomethyl ether, monoethyl ether, monopropyl ether, monobutyl ether or monophenyl ether of dipropylene glycol monoacetate; cyclic ethers such as dioxane; and esters such as methyl lactate, ethyl lactate (EL), methyl acetate, ethyl acetate, butyl acetate, methyl pyruvate, ethyl pyruvate, methyl methoxypropionate, and ethyl ethoxypropionate.

These organic solvents may be used either alone, or as a mixed solvent of two or more different solvents.

Furthermore, mixed solvents prepared by mixing propylene glycol monomethyl ether acetate (PGMEA) and a polar solvent are preferred, and although the blend ratio (weight ratio) in such mixed solvents can be set in accordance with factors such as the compatibility of the PGMEA and the polar solvent, the ratio is preferably within a range of from 1:9 to 9:1, and even more preferably from 2:8 to 8:2.

More specifically, in those cases where EL is added as the polar solvent, the weight ratio PGMEA:EL is preferably within a range of from 2:8 to 8:2, and even more preferably from 3:7 to 7:3.

Furthermore, as the organic solvent, mixed solvents containing at least one of PGMEA and EL, together with γ-butyrolactone, are also preferred. In such cases, the weight ratio of the former and latter components in the mixed solvent is preferably within a range of from 70:30 to 95:5.

There are no particular restrictions on the quantity used of the organic solvent, although the quantity should provide a concentration that enables favorable application of the solution to a support such as a substrate or the like, and should be set in accordance with the required coating film thickness, and is typically set within a range of from 2 to 20% by weight, and even more preferably from 5 to 15% by weight, in terms of the solid fraction concentration.

<Fifth Aspect>

A positive resist composition of the fifth aspect of the present invention includes a resin (A'), which contains acid-dissociable, dissolution-inhibiting groups and exhibits increased alkali solubility under the action of acid, and a compound (B) (the component (B)) that generates acid on irradiation, wherein the resin (A') (hereafter referred to as the component (A')) contains a cyclic group-containing principal chain polymer (A1), and a polymer (A'2) containing solely structural units (a') derived from a (meth)acrylate ester and/or (meth)acrylic acid.

Because the component (A') includes acid-dissociable, dissolution-inhibiting groups, the component is insoluble in alkali prior to exposure, but when the acid generated from the component (B) by exposure acts upon the component (A'), these acid-dissociable, dissolution-inhibiting groups dissociate, causing an increase in the alkali solubility of the entire component (A'). As a result, when the resist is selectively exposed during the formation of a resist pattern, or alternatively, is exposed and then subjected to post exposure baking (PEB), the exposed portions of the resist shift to an alkali-soluble state, whereas the unexposed portions remain insoluble in alkali, meaning that alkali developing can then be used to form a positive resist pattern.

Component (A')

The component (A') is a mixture of a cyclic group-containing principal chain polymer (A1) (hereafter also referred to as the component (A1)) and a polymer (A'2) containing solely structural units (a') derived from a (meth)acrylate ester and/or (meth)acrylic acid.

In the present invention, at least one of the polymer (A'1) and the polymer (A'2) must contain acid-dissociable, dissolution-inhibiting groups. Those cases in which the polymer (A1) and the polymer (A'2) both contain acid-dissociable, dissolution-inhibiting groups are particularly preferred as they provide superior resist pattern shape and resolution. Of the various possibilities, cases in which both polymers contain acid-dissociable, dissolution-inhibiting groups of the same structure are particularly desirable, as they offer further improvements in the above effects. It is presumed that the reason for this observation is that because the structure of the acid-dissociable, dissolution-inhibiting groups in the polymer (A1) and the structure of the acid-dissociable, dissolution-inhibiting groups in the polymer (A'2) are the same, the acid-dissociable, dissolution-inhibiting groups within each polymer can be dissociated under substantially the same conditions during the lithography process.

Furthermore, in a similar manner, at least one of the polymer (A'1) and the polymer (A'2) preferably contains a structural unit containing a lactone ring, as such polymers enable favorable levels of resolution and adhesion to substrates to be obtained. Those cases in which the polymer (A1) and the polymer (A'2) both contain a structural unit containing a lactone ring are particularly preferred as they provide superior levels of the above effects. Of the various possibilities, cases in which both polymers contain lactone rings of the same structure are particularly desirable, as they offer further improvements in the above effects, and also exhibit excellent lithography characteristics such as the depth of focus. It is presumed that the reason for this observation is that because the structure of the lactone ring of the structural unit (a2) within the polymer (A'1) and the structure of the lactone ring of the structural unit (a'2) within the polymer (A'2) are the same, the differences between the properties of the two polymers (A1) and (A'2), including the glass transition temperature (Tg) and the affinity of the polymer for the developing solution, are minimized, meaning the optimum lithography conditions (such as the bake temperature and the like) for each of the lone polymers become more similar.

As follows is a more detailed description of each of the polymers.

[Polymer (A'1)]

In the present invention, a "cyclic group-containing principal chain polymer" refers to a polymer in which the structural units that constitute the polymer contain a monocyclic or polycyclic ring structure, and include structural units (hereafter referred to as cyclic principal chain structural units) in which at least one, and preferably two or more of the carbon atoms within that ring structure form the principal chain.

Including a polymer (A'1) of this structure ensures an excellent level of etching resistance when the composition is used as a resist. It is presumed that this observation is because including cyclic principal chain structural units results in an increase in carbon density.

Examples of these cyclic principal chain structural units include the aforementioned structural units (a1) through (a3), that is, structural units derived from a polycyclic olefin (hereafter referred to as a polycycloolefin) such as bicyclo[2.2.1]-2-heptene (norbornene) or tetracyclo[$4.4.0.1^{2,5}.1^{7,10}$]-3-dodecene, as well as dicarboxylic anhydride group-containing structural units listed in relation to the aforementioned structural unit (a4). Of these, the inclusion of structural units derived from polycycloolefins within the principal chain is preferred, as the resulting polymers offer excellent etching resistance when used as a resist.

In addition to the cyclic principal chain structural units, the polymer (A'1) may also include structural units derived from a (meth)acrylate ester and/or (meth)acrylate acid, such as those units described below in relation to the polymer (A'2), although in terms of achieving favorable effects for the present invention, the proportion of cyclic principal chain structural units within the polymer (A'), relative to the combined total of all the structural units that constitute the polymer (A'1), is preferably within a range of from 50 to 100 mol %, and is even more preferably from 80 to 100 mol %.

From the viewpoint of achieving improved resolution, the polymer (A'1) preferably includes a structural unit (a1) represented by the above general formula (a-1). A structural unit in which, in the formula (a-1), $R^1$ represents an ethyl group and t represents 2 is particularly preferred. In other words, a structural unit that contains a 1-ethyl-1-cyclohexyl group as the acid-dissociable, dissolution-inhibiting group provides superior improvement in the above effect, and is consequently preferred.

As the structural unit (a1), either a single type of structural unit may be used alone, or a combination of two or more different structural units may be used.

Within the polymer (A'1), the proportion of the structural unit (a1), relative to the combined total of all the structural units that constitute the resist composition polymer of the present invention, is preferably within a range of from 10 to 80 mol %, and even more preferably from 30 to 60 mol %. Ensuring that this proportion is at least as large as the lower limit of the above range enables a more favorable pattern to be obtained when the polymer is used as a resist composition, whereas ensuring that the proportion is no greater than the upper limit enables a more favorable balance to be achieved with the other structural units.

In addition to the above structural unit (a1), the polymer (A'1) preferably also contains a structural unit (a2) represented by the above general formula (a-2).

Including a structural unit (a2) within the polymer (A'1) further improves the resolution. It is presumed that the reason for this observation is that the structural unit (a2) increases the hydrophilicity of the entire polymer (A'1), meaning when the polymer (A'1) is used within a resist composition, the affinity between the resist film produced using the resist composition and the alkali developing solution is enhanced.

As the structural unit (a2), either a single type of structural unit may be used alone, or a combination of two or more different structural units may be used.

Within the polymer (A1), the proportion of the structural unit (a2), relative to the combined total of all the structural units that constitute the polymer (A'1), is preferably within a range of from 10 to 80 mol %, and even more preferably from 30 to 60 mol %. Ensuring that this proportion is at least as large as the lower limit of the above range results in a superior improvement in the resolution, whereas ensuring that the proportion is no greater than the upper limit enables a more favorable balance to be achieved with the other structural units.

In a polymer (A1), the combination of the above structural units (a1) and (a2) preferably accounts for 20 to 90 mol %, and even more preferably from 50 to 80 mol %, of all the structural units that constitute the polymer (A'1).

In addition to the above structural units (a1) and (a2), the polymer (A'1) preferably also contains a structural unit (a3) represented by the above general formula (a-3).

As the structural unit (a3), either a single type of structural unit may be used alone, or a combination of two or more different structural units may be used.

Within the polymer (A'1), the proportion of the structural unit (a3), relative to the combined total of all the structural units that constitute the polymer (A'1), is preferably within a range of from 5 to 40 mol %, and even more preferably from 10 to 30 mol %. Ensuring that this proportion is at least as large as the lower limit of the above range results in improved resolution and more favorable adhesion to substrates, whereas ensuring that the proportion is no greater than the upper limit enables a more favorable balance to be achieved with the other structural units.

The polymer (A'1) may also include an aforementioned structural unit (a4) besides the aforementioned structural units (a1) to (a3), provided the inclusion of such a unit does not impair the effects of the present invention.

As described above, the structural unit (a4) may be any other structural unit which cannot be classified as one of the above structural units (a1) through (a3), and which is derived from a monomer that is copolymerizable with the monomers that give rise to the structural units (a1) to (a3), and there are no particular restrictions.

As the structural unit (a4), any structural unit derived from a conventional compound containing an ethylenic double bond can be used in accordance with the intended purpose of the polymer.

More specific examples of the structural unit (a4) include the aforementioned structural units derived from polycycloolefins containing no substituent groups and structural units derived from polycycloolefins containing a polycyclic alicyclic group as a substituent, as well as dicarboxylic anhydride-containing structural units, and structural units (a') derived from a (meth)acrylate ester and/or (meth)acrylate acid described below in relation to the polymer (A'2).

A dicarboxylic anhydride-containing structural unit refers to a structural unit that contains a —C(O)—O—C(O)— structure. Examples of such units include structural units that contain a monocyclic or polycyclic cyclic acid anhydride, and more specific examples include the units shown below in formulas (b-1) and (b-2), which are derived from a monocyclic or polycyclic maleic anhydride, and the structural unit shown below in formula (b-3), which is derived from itaconic acid.

[Formula 8]

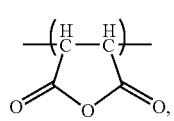
(b-1)

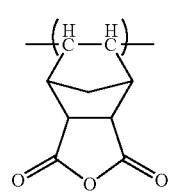
(b-2)

[Formula 9]

-continued

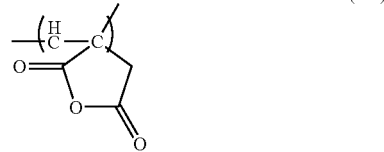
(b-3)

In the polymer (A'1), the combination and relative proportions of the structural units (a1) through (a4) can be selected and adjusted in accordance with the characteristics required. From the viewpoints of achieving favorable shape, etching resistance, and lithography characteristics such as resolution for the resulting resist pattern, the polymer preferably contains the structural units (a1) and (a2), and polymers that contain the structural units (a1) through (a3) are even more desirable.

In those cases where the polymer (A'1) is a binary polymer that contains the structural unit (a1) and the structural unit (a2), but does not include the structural unit (a3) (but may include a structural unit (a4)), from the viewpoints of achieving favorable effects for the present invention and enabling more ready control during synthesis of the polymer, the respective proportions (molar ratios) of each of the structural units, relative to the combined total of all the structural units that constitute the polymer (A'1), are preferably within a range of from 10 to 80 mol % and even more preferably from 30 to 60 mol % for the structural unit (a1), and preferably within a range of from 10 to 80 mol % and even more preferably from 30 to 60 mol % for the structural unit (a2).

Furthermore, in the case of a ternary polymer that includes the structural unit (a3) in addition to the structural units (a1) and (a2) (and may also include a structural unit (a4)), the respective proportions (molar ratios) of each of the structural units, relative to the combined total of all the structural units that constitute the polymer (A'1), are preferably within a range of from 10 to 80 mol %, and even more preferably from 30 to 60 mol % for the structural unit (a1), preferably within a range of from 10 to 80 mol %, and even more preferably from 30 to 60 mol % for the structural unit (a2), and preferably within a range of from 5 to 40 mol % and even more preferably from 10 to 30 mol % for the structural unit (a3). Such proportions yield superior levels of etching resistance and resist pattern shape, and also provide excellent lithography characteristics such as resolution.

Specific examples of preferred forms of the polymer (A'1) include the polymers (A11) represented by the general formula (a-11) shown above. These polymers (A11) provide excellent etching resistance and resist pattern shape, exhibit excellent lithography characteristics such as resolution, and superior adhesion to substrates, and are also resistant to pattern collapse.

The polymer (A'1) can be obtained, for example, by a conventional radical polymerization or the like of the monomers corresponding with each of the structural units, using a radical polymerization initiator such as azobisisobutyronitrile (AIBN).

The weight average molecular weight (the polystyrene equivalent weight average molecular weight determined by gel permeation chromatography, this also applies below) of the polymer (A1) is preferably no higher than 15,000, and is even more preferably 10,000 or lower. Weight average molecular weights of no higher than 15,000 offer various advantages, including excellent etching resistance, resistance to swelling of the resist pattern during developing, and favorable resistance to pattern collapse.

There are no particular restrictions on the lower limit, although from the viewpoints of achieving favorable resolution and favorable solubility in organic solvents, the weight average molecular weight is preferably at least 3,000, and is even more preferably 5,000 or higher.

The polymer (A'1) may include either a single polymer or a combination of two or more different polymers.

[Polymer (A'2)]

The polymer (A'2) is a polymer containing solely structural units (a') derived from a (meth)acrylate ester and/or (meth)acrylic acid.

In this description, the expression "structural units (a') derived from a (meth)acrylate ester and/or (meth)acrylic acid" refers to one or more structural units selected from the group consisting of structural units derived from acrylate esters, wherein R in a general formula shown below is a hydrogen atom and X is a monovalent organic group, structural units derived from methacrylate esters, wherein R is a methyl group and X is a monovalent organic group, structural units derived from acrylic acid, wherein R and X are both hydrogen atoms, and structural units derived from methacrylic acid, wherein R is a methyl group and X is a hydrogen atom.

Furthermore, the expression "containing solely structural units (a')" means the principal chain of the polymer (A'2) is formed solely from the structural units (a'), and contains no other structural units.

[Formula 10]

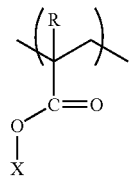

[wherein, R represents a hydrogen atom or a methyl group, and X represents a hydrogen atom or a monovalent organic group]

In the above formula, there are no particular restrictions on the monovalent organic group of the group X, and suitable examples include the groups bonded to the ester side chain portion of the (meth)acrylate ester within the structural units exemplified for the structural units (a'1) through (a'4) described below (namely, acid-dissociable, dissolution-inhibiting groups, groups containing a lactone ring, polar group-containing aliphatic hydrocarbon groups, and polycyclic aliphatic hydrocarbon groups).

—Structural Unit (a'1)

The structural units (a') preferably include a structural unit (a'1) derived from a (meth)acrylate ester that contains an acid-dissociable, dissolution-inhibiting group.

There are no particular restrictions on the acid-dissociable, dissolution-inhibiting group within the structural unit (a'1). Typically, groups that form a cyclic or chain-like tertiary alkyl ester with the carboxyl group of the (meth)acrylic acid are the most widely known, but from the viewpoints of achieving superior dry etching resistance and favorable resist pattern formation, the use of an dissociable, dissolution inhibiting group that contains a monocyclic or polycyclic alicyclic group is preferred.

Examples of suitable monocyclic alicyclic groups include groups in which one hydrogen atom has been removed from a monocycloalkane such as cyclohexane or cyclopentane.

Examples of suitable polycyclic alicyclic groups include groups in which one or two hydrogen atoms have been removed from a polycycloalkane such as a bicycloalkane, tricycloalkane or tetracycloalkane, and specific examples include groups in which one or two hydrogen atoms have been removed from a polycycloalkane such as adamantane, norbornane, isobornane, tricyclodecane or tetracyclododecane.

These types of monocyclic and polycyclic alicyclic groups can be appropriately selected from the multitude of groups proposed for the resin components of resist compositions designed for use with ArF excimer lasers.

Of these groups, a cyclohexyl group, cyclopentyl group, adamantyl group, norbornyl group, or tetracyclododecanyl group is preferred from the viewpoint of industrial availability.

Specific examples of preferred structural units (a'1) include structural units derived from a (meth)acrylate ester that contains a monocyclic alicyclic group-containing acid-dissociable, dissolution-inhibiting group, such as the structural units represented by a general formula (a-5) shown below, and structural units derived from a (meth)acrylate ester that contains a polycyclic alicyclic group-containing acid-dissociable, dissolution-inhibiting group, such as the structural units represented by the general formulas (I), (II) and (III) shown below.

[Formula 11]

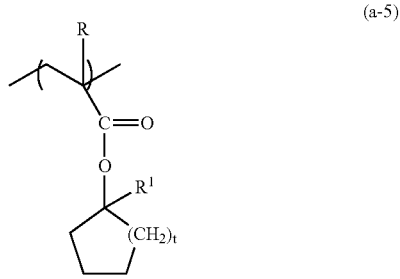

(a-5)

[In the formula (a-5), R represents a hydrogen atom or a methyl group, $R^1$ represents an alkyl group of two or more carbon atoms, and t represents an integer from 1 to 3.]

[Formula 12]

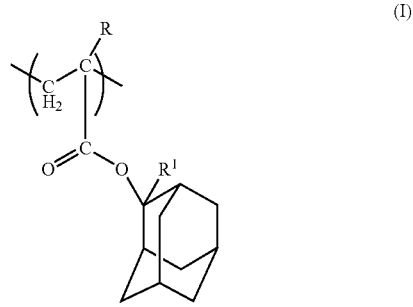

(I)

[In the formula (I), R represents a hydrogen atom or a methyl group, and $R^{11}$ represents a lower alkyl group.]

[Formula 13]

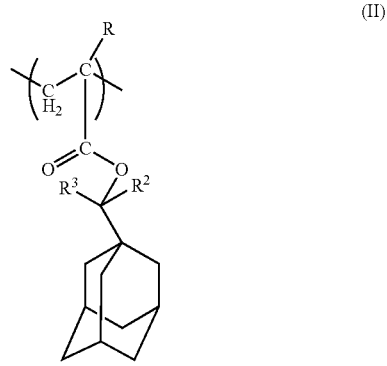

(II)

[In the formula (II), R represents a hydrogen atom or a methyl group, and $R^2$ and $R^3$ each represent, independently, a lower alkyl group.]

[Formula 14]

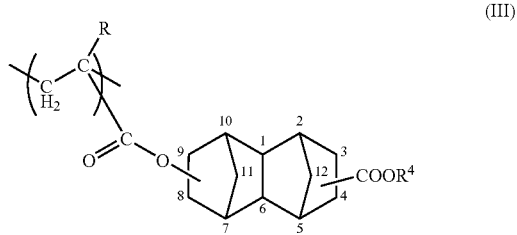

(III)

[In the formula (III), R represents a hydrogen atom or a methyl group, and $R^4$ represents a tertiary alkyl group.]

In the formula (a-5), the group $R^1$ is preferably a straight-chain or branched lower alkyl group of 1 to 5 carbon atoms, and specific examples include a methyl group, ethyl group, propyl group, isopropyl group, n-butyl group, isobutyl group, pentyl group, isopentyl group, or neopentyl group. Of these, an alkyl group of two or more carbon atoms, and particularly from 2 to 5 carbon atoms, is preferred, and such groups tend to exhibit a higher acid dissociability than the case of a methyl group. From an industrial viewpoint, a methyl group or ethyl group is preferred.

In the formula (I), the group $R^{11}$ is preferably a straight-chain or branched lower alkyl group of 1 to 5 carbon atoms, and specific examples include a methyl group, ethyl group, propyl group, isopropyl group, n-butyl group, isobutyl group, pentyl group, isopentyl group, or neopentyl group. Of these, an alkyl group of two or more carbon atoms, and particularly from 2 to 5 carbon atoms, is preferred, and such groups tend to exhibit a higher acid dissociability than the case of a methyl group. From an industrial viewpoint, a methyl group or ethyl group is preferred.

The groups $R^2$ and $R^3$ each preferably represent, independently, a lower alkyl group of 1 to 5 carbon atoms. These types of groups tend to exhibit a higher acid dissociability than a 2-methyl-2-adamantyl group.

Specifically, the groups $R^2$ and $R^3$ each preferably represent, independently, the same types of straight-chain or branched lower alkyl groups described above for $R^1$. Of these groups, the case in which $R^2$ and $R^3$ are both methyl groups is preferred from an industrial viewpoint, and a structural unit derived from 2-(1-adamantyl)-2-propyl (meth)acrylate can be mentioned as a specific example.

The group $R^4$ represents a tertiary alkyl group such as a tert-butyl group or tert-amyl group, although the case in which $R^4$ is tert-butyl group is preferred from an industrial viewpoint.

Furthermore, the group —$COOR^4$ may be bonded to either position 3 or 4 of the tetracyclododecanyl group shown in the formula, although a mixture of both isomers results, and so the bonding position cannot be further specified. Furthermore, the carboxyl group residue of the (meth)acrylate ester may be bonded to either position 8 or 9 of the tetracyclododecanyl group, although similarly, the bonding position cannot be further specified.

Of the above possibilities, particularly in those cases where the polymer (A'1) is a polymer that contains a structural unit (a1), a structural unit represented by the formula (a-5) provides particularly superior resolution as well as excellent lithography characteristics such as the depth of focus, and is consequently preferred. Furthermore, in such cases, the group $R^1$ and the number t within the structural unit represented by the formula (a-5) are preferably the same as the group $R^1$ and the number t within the structural unit (a1).

The proportion of the structural unit (a'1), relative to the combined total of all the structural units that constitute the polymer (A'2), is preferably within a range of from 20 to 60 mol %, and even more preferably from 30 to 50 mol %. Ensuring that this proportion is at least as large as the lower limit of the above range enables a more favorable pattern to be obtained when the polymer is used as a resist composition, whereas ensuring that the proportion is no greater than the upper limit enables a more favorable balance to be achieved with the other structural units.

—Structural Unit (a'2)

In a polymer (A'2), the structural units (a') preferably also include, in addition to the structural unit (a'1), a structural unit (a'2) derived from a (meth)acrylate ester that contains a lactone ring. Including such a structural unit improves the adhesion between the resist film and the substrate, and suppresses the occurrence of pattern collapse and film peeling and the like within fine resist patterns. Furthermore, the hydrophilicity of the polymer (A'2) is also enhanced, thereby improving the affinity with the developing solution, improving the alkali solubility within the exposed portions of the resist, and contributing to further improvement in the resolution.

Examples of the structural unit (a'2) include structural units in which a monocyclic group composed of a lactone ring, or a polycyclic alicyclic group containing a lactone ring, is bonded to the ester side chain portion of a (meth)acrylate ester. The term "lactone ring" refers to a single ring containing a —O—C(O)— structure, and this ring is counted as the first ring. Accordingly, the case in which the only ring structure is the lactone ring is referred to as a monocyclic group, and groups containing other ring structures are described as polycyclic groups regardless of the structure of the other rings.

Examples of the structural unit (a'2) include monocyclic groups in which one hydrogen atom has been removed from γ-butyrolactone, and polycyclic groups in which one hydrogen atom has been removed from a lactone ring-containing bicycloalkane.

Specific examples include structural units derived from a (meth)acrylate ester containing a monocyclic group composed of a monocyclic lactone ring, such as the structural units represented by a general formula (a-6) shown below, and structural units derived from (meth)acrylate esters containing a polycyclic alicyclic group that contains a lactone ring, such as the structural units represented by formulas (IV) through (VII) shown below.

[Formula 15]

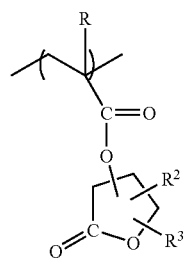

(a-6)

[In the formula (a-6), R represents a hydrogen atom or a methyl group, and $R^2$ and $R^3$ each represent, independently, a hydrogen atom or a lower alkyl group.]

[Formula 16]

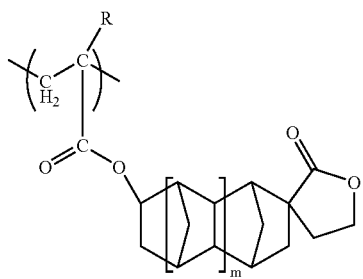

(IV)

(wherein, R is as defined above, and m represents either 0 or 1)

[Formula 17]

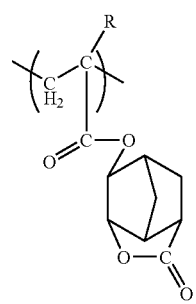

(V)

(wherein, R is as defined above)

[Formula 18]

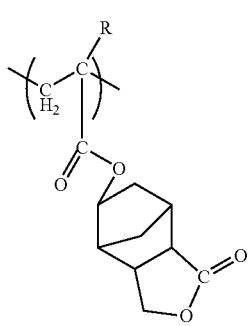

(VI)

(wherein, R is as defined above)

Of the above possibilities, particularly in those cases where the polymer (A'1) is a polymer that contains a structural unit (a2), a structural unit represented by the formula (a-6) provides particularly superior resolution as well as excellent lithography characteristics such as depth of focus, and is consequently preferred. Furthermore, in such cases, the groups $R^2$ and $R^3$ within the structural unit represented by the formula (a-6) are preferably the same as the groups $R^2$ and $R^3$ within the structural unit (a2).

The proportion of the structural unit (a'2), relative to the combined total of all the structural units that constitute the polymer (A'2), is preferably within a range of from 20 to 60 mol %, and even more preferably from 20 to 50 mol %.

—Structural Unit (a'3)

In a polymer (A'2), the structural units (a') preferably also include, either in addition to the structural unit (a'1), or in addition to the structural unit (a'1) and the structural unit (a'2), a structural unit (a'3) derived from a (meth)acrylate ester that contains a polar group-containing aliphatic hydrocarbon group. Including such a structural unit enhances the hydrophilicity of the polymer (A'2), thereby improving the affinity with the developing solution, improving the alkali solubility within the exposed portions of the resist, and contributing to further improvement in the resolution.

Examples of the polar group include a hydroxyl group or cyano group or the like, although a hydroxyl group is particularly preferred.

Examples of the aliphatic hydrocarbon group include straight-chain or branched hydrocarbon groups (alkylene groups) of 1 to 10 carbon atoms, and polycyclic aliphatic hydrocarbon groups (polycyclic groups). These polycyclic groups can be selected appropriately from the same multitude of polycyclic groups described above in relation to the structural unit (a'1).

When the hydrocarbon group within the polar group-containing aliphatic hydrocarbon group is a straight-chain or branched hydrocarbon group of 1 to 10 carbon atoms, the structural unit (a'3) is preferably a structural unit derived from the hydroxyethyl ester of (meth)acrylic acid, whereas when the hydrocarbon group is a polycyclic group, structural units represented by formulas (VII) and (VIII) shown below are preferred.

[Formula 19]

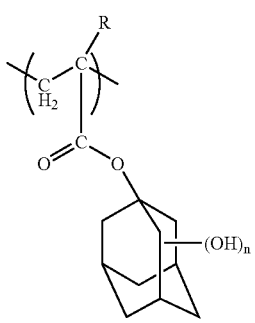

(VII)

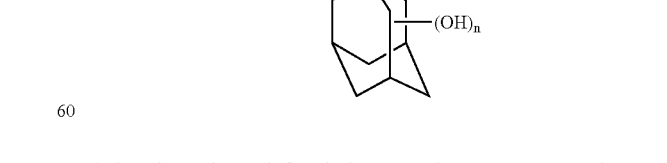

(wherein, R is as defined above, and n represents an integer from 1 to 3)

Of these, structural units in which n is 1, and the hydroxyl group is bonded to position 3 of the adamantyl group, are preferred.

[Formula 20]

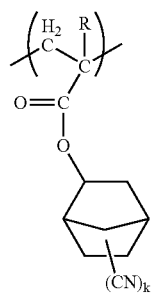

(VIII)

(wherein, R is as defined above, and k represents an integer from 1 to 3)

Of these, structural units in which k is 1 are preferred. These structural units exist as a mixture of isomers (that is, a mixture of compounds in which the cyano group is bonded to either position 4 or position 5 of the norbornyl group).

The proportion of the structural unit (a'3), relative to the combined total of all the structural units that constitute the polymer (A'2), is preferably within a range of from 10 to 50 mol %, and even more preferably from 20 to 40 mol %.

—Structural Units (a'4), (a'5)

A polymer (A'2) may also include a structural unit (a'4) derived from a (meth)acrylate ester that contains a polycyclic aliphatic hydrocarbon group, or a structural unit (a'5) derived from (meth)acrylic acid, provided these structural units are different from the structural units (a'1) through (a'3).

Herein, the expression "different from the structural units (a'1) through (a'3)" means these units do not duplicate the structural units (a'1) through (a'3), although examples of the polycyclic aliphatic hydrocarbon group (hereafter also referred to as simply "the polycyclic group") include the same multitude of polycyclic groups described above in relation to the structural units (a'1) through (a'3). From the viewpoint of industrial availability and the like, one or more groups selected from amongst a tricyclodecanyl group, adamantyl group, and tetracyclododecanyl group is preferred.

Specific examples of the structural unit (a'4) include units with the structures represented by the formulas (IX) through (XI) shown below.

[Formula 21]

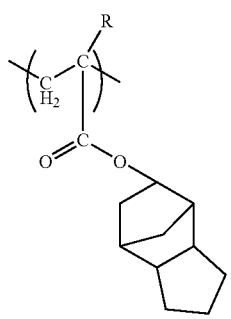

(IX)

(wherein, R is as defined above)

[Formula 22]

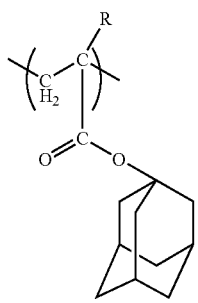

(X)

(wherein, R is as defined above)

[Formula 23]

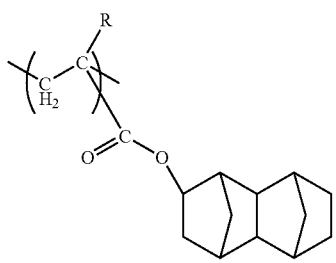

(XI)

(wherein, R is as defined above)

The proportion of the structural unit (a'4), relative to the combined total of all the structural units that constitute the polymer (A'2), is preferably within a range of from 1 to 25 mol %, and even more preferably from 10 to 20 mol %.

The proportion of the structural unit (a'5), relative to the combined total of all the structural units that constitute the polymer (A'2), is preferably within a range of from 1 to 25 mol %, and even more preferably from 10 to 20 mol %.

In the polymer (A'2), the combination and relative proportions of the structural units (a'1) through (a'4) can be selected and adjusted in accordance with the characteristics required. From the viewpoint of achieving favorable resist pattern shape and resolution, the polymer preferably contains the structural units (a'1) and (a'2), and/or the structural unit (a'3), and polymers that contain all of the structural units (a'1) through (a'3) are particularly desirable.

Specific examples of preferred forms of the polymer (A'2) include polymers (A21) represented by a general formula (a-21) shown below. These polymers (A21) exhibit excellent lithography characteristics such as resolution and depth of focus, and yield resist patterns with superior shape and rectangular formability, and can be favorably combined with the aforementioned polymers (A'1).

[Formula 24]

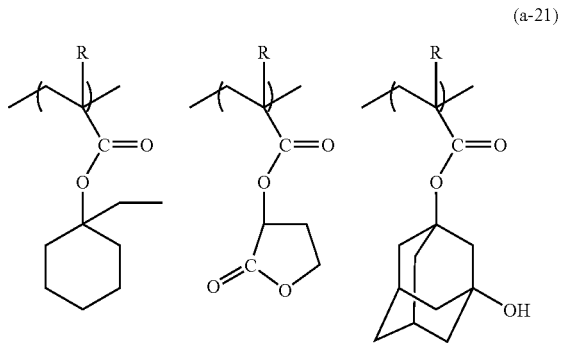

(a-21)

[In the formula (a-21), R represents a hydrogen atom or a methyl group.]

The polymer (A'2) can be obtained, for example, by a conventional radical polymerization or the like of the monomers corresponding with each of the structural units, using a radical polymerization initiator such as azobisisobutyronitrile (AIBN).

The weight average molecular weight (the polystyrene equivalent weight average molecular weight determined by gel permeation chromatography, this also applies below) of the polymer (A'2) is preferably no higher than 15,000, and is even more preferably 10,000 or lower. Weight average molecular weights of no higher than 15,000 offer various advantages, including excellent etching resistance, resistance to swelling of the resist pattern during developing, and favorable resistance to pattern collapse.

There are no particular restrictions on the lower limit, although from the viewpoints of achieving favorable resolution and favorable solubility in organic solvents, the weight average molecular weight is preferably at least 3,000, and is even more preferably 5,000 or higher.

The polymer (A'2) may include either a single polymer or a combination of two or more different polymers.

In the component (A'), there are no particular restrictions on the mixing ratio (weight ratio) between the polymer (A'1) and the polymer (A'2), although higher proportions of the polymer (A'1) tend to improve the etching resistance, whereas higher proportions of the polymer (A'2) tend to result in more favorable resist pattern shapes, and consequently the ratio may be selected in accordance with the properties required of the resulting resist. In order to ensure favorable effects for the present invention, the mixing ratio is preferably within a range of from 1:9 to 9:1, is even more preferably within a range of from 2:8 to 5:5, and is most preferably within a range of from 2:8 to 4:6.

Component (B)

The component (B) is the so-called acid generator, and is the same as the acid generator used in the fourth aspect.

In the fifth aspect of the present invention, of the various possibilities, the component (B) preferably uses an onium salt with a fluorinated alkylsulfonate ion as the anion, as such compounds provide superior reactivity with the component (A').

As the component (B), either a single acid generator may be used alone, or a combination of two or more different acid generators may be used.

The quantity used of the component (B) is typically within a range of from 0.5 to 30 parts by weight, and preferably from 1 to 10 parts by weight, per 100 parts by weight of the component (A'). By ensuring that the quantity is at least as large as the lower limit of the above range, favorable pattern formation can be achieved, whereas ensuring that the proportion is no greater than the upper limit enables a uniform solution to be obtained, and can prevent deterioration in the storage stability.

A positive resist composition according to the fifth aspect of the present invention may also include one or more optional components selected from amongst a nitrogen-containing organic compound (D) (the component (D)), an organic carboxylic acid, or a phosphorus oxo acid or derivative thereof (E) (the component (E)), other optional components, or an organic solvent, all of which are described above in detail in relation to the fourth aspect.

The component (D) and the component (E) are each typically used in a quantity within a range of from 0.01 to 5.0 parts by weight per 100 parts by weight of the component (A').

There are no particular restrictions on the quantity used of the organic solvent, although the quantity should provide a concentration that enables favorable application of the solution to a support such as a substrate or the like, and should be set in accordance with the required coating film thickness, and is typically set within a range of from 2 to 20% by weight, and even more preferably from 5 to 15% by weight, in terms of the solid fraction concentration.

<<Method for Forming Resist Pattern>>

<Sixth Aspect>

A method for forming a resist pattern that uses a positive resist composition according to the present invention can be conducted, for example, in the manner described below.

Namely, a positive resist composition described above is first applied to a support such as a silicon wafer using a spinner or the like, a prebake is then conducted under temperature conditions of 80 to 150° C., for a period of 40 to 120 seconds, and preferably for 60 to 90 seconds, and following selective exposure (irradiation) of the thus obtained film with an ArF exposure apparatus or the like, by irradiating ArF excimer laser light through a desired mask pattern, PEB (post exposure baking) is conducted under temperature conditions of 80 to 150° C., for a period of 40 to 120 seconds, and preferably for 60 to 90 seconds. Subsequently, developing is conducted using an alkali developing solution such as a 0.1 to 10% by weight aqueous solution of tetramethylammonium hydroxide. In this manner, a resist pattern that is faithful to the mask pattern can be obtained.

An organic or inorganic anti-reflective film may also be provided between the support (substrate) and the applied layer of the resist composition.

As the support, conventional materials can be used without any particular restrictions, and suitable examples include substrates for electronic componentry, as well as substrates on which a predetermined wiring pattern has already been formed.

Specific examples of suitable substrates include silicon wafers, metal-based substrates such as copper, chrome, iron, and aluminum, as well as glass substrates.

Suitable materials for the wiring pattern include copper, solder, chrome, aluminum, nickel, and gold.

There are no particular restrictions on the wavelength used for the exposure (irradiation), and an ArF excimer laser, KrF excimer laser, $F_2$ excimer laser, or other radiation such as EUV (extreme ultraviolet), VUV (vacuum ultraviolet), EB (electron beam), X-ray or soft X-ray radiation can be used. A resist composition according to the present invention is particularly effective for use with an ArF excimer laser.

As described above, by using a positive resist composition that includes a polymer of the present invention, a resist pattern with excellent resolution and superior etching resistance can be formed. This resolution suffers almost no deterioration even in cases where highly reflective substrates are used without an antireflective film.

Of the various polymers, cases in which the polymer of the present invention includes the structural unit (a3) yield positive resist compositions which exhibit particularly superior adhesion to substrates, and which enable favorable suppression of pattern collapse of the resist pattern.

Of these polymers, polymers in which the alkali-soluble group within the structural unit (a3) is a group represented by the aforementioned general formula (a-4) yield resist patterns with excellent shape.

Furthermore, a positive resist composition of the present invention exhibits excellent etching resistance, is resistant to deterioration in the resolution even when a highly reflective substrate is used, and also exhibits excellent adhesion to substrates and superior heat resistance. As a result, the composition can be used as a mask for conducting ion injection into a substrate. In those cases where the composition is used as this type of mask, the film thickness of the resist is preferably somewhat thicker than the resist pattern film thickness (approximately 300 to 400 nm) used in typical semiconductor element production, and for example, is preferably within a range of from 1,000 to 2,000 n.

Furthermore, a resist pattern obtained using a positive resist composition according to the fifth aspect of the present invention exhibits a high level of etching resistance, and has a shape with a high level of rectangular formability, including superior perpendicularity of the pattern side walls, and reduced line edge roughness.

Particularly in those cases where the polymer (A'1) and the polymer (A'2) contain acid-dissociable, dissolution-inhibiting groups of the same structure (such as the case in which the polymer (A1) contains a structural unit (a1) and the polymer (A'2) contains a structural unit represented by the general formula (a-5)), a variety of lithography characteristics, such as the resolution, linearity, depth of focus, and exposure margin also reach superior levels. This effect is even more pronounced in those cases where the polymer (A'1) and the polymer (A'2) both contain lactone rings of the same structure (such as the case in which the polymer (A11) contains a structural unit (a2), and the polymer (A'2) contains a structural unit represented by the general formula (a-6)).

EXAMPLES

As follows is a more detailed description of the present invention using a series of examples, although the present invention is in no way limited by these examples.

The monomer components used in Synthesis Examples of the present invention are shown below.

[Formula 25]

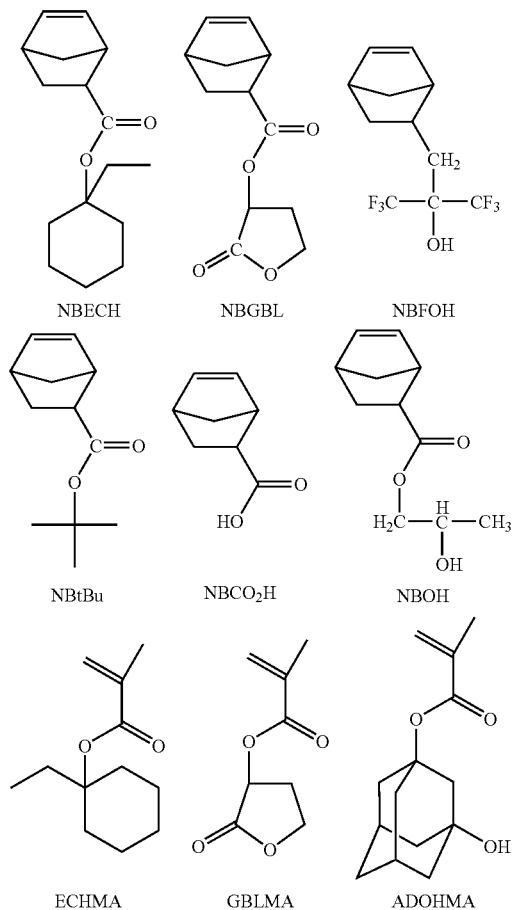

Synthesis Examples 1 through 3, and 5 through 6 were conducted with reference to the technique disclosed in J. Photopolym. Sci. Technol., Vol. 15, No. 4, 2002 (619). Synthesis Example 4 is a typical radical polymerization reaction.

Synthesis Example 1

25.6 g of NBECH, 24.0 g of NBGBL, and 11.0 g of NBFOH were dissolved in 75 ml of dichloromethane, and a catalyst prepared from 4.3 g of silver borofluoride and 2.0 g of allyl chloride palladium dimer was then added dropwise to the solution. The resulting mixture was then stirred for 24 hours, yielding a crude polymer solution. This polymer solution was purified by conducting reprecipitation in n-heptane twice, and the precipitated resin was then collected by filtration and dried under reduced pressure, yielding a white resin. This resin was termed polymer 1 (represented by a general formula (1) shown below). Measurement by GPC (gel permeation chromatography) revealed a molecular weight (Mw) for the polymer 1 of 14,300, and a polydispersity (Mw/Mn) of 1.7. Furthermore, analysis by carbon-13 nuclear magnetic resonance spectroscopy ($^{13}$C-NMR) revealed a compositional ratio p:q:r=40:40:20 (molar ratio).

[Formula 26]

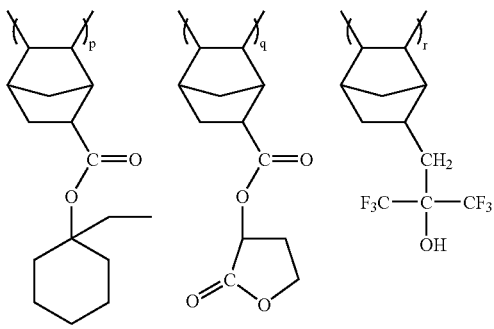

(1)

[Formula 27]

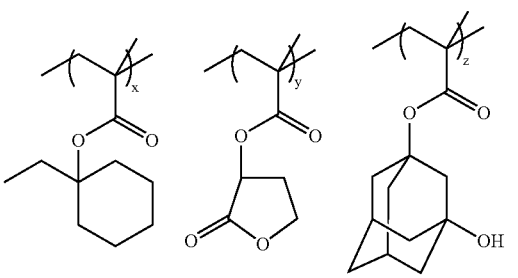

(4)

Synthesis Example 2

32.2 g of NBECH, 18.0 g of NBGBL, and 11.0 g of NBFOH were dissolved in 75 ml of dichloromethane, and a catalyst prepared from 4.3 g of silver borofluoride and 2.0 g of allyl chloride palladium dimer was then added dropwise to the solution. The resulting mixture was then stirred for 24 hours, yielding a crude polymer solution. This polymer solution was purified by conducting reprecipitation in n-heptane twice, and the precipitated resin was then collected by filtration and dried under reduced pressure, yielding a white resin. This resin was termed polymer 2 (represented by the above general formula (I)). Measurement by GPC revealed a molecular weight (Mw) for the polymer 2 of 13,300, and a polydispersity (Mw/Mn) of 1.89. Furthermore, analysis by carbon-13 nuclear magnetic resonance spectroscopy ($^{13}$C-NMR) revealed a compositional ratio p:q:r=50:30:20 (molar ratio).

Synthesis Example 3

With the exception of adjusting the molecular weight to a value of 7,000, synthesis was conducted in the same manner as in Synthesis Example 2. This resin was termed polymer 3 (represented by the above general formula (I)). Measurement by GPC revealed a molecular weight (Mw) for the polymer 3 of 7,000, and a polydispersity (Mw/Mn) of 1.8. Furthermore, analysis by carbon-13 nuclear magnetic resonance spectroscopy ($^{13}$C-NMR) revealed a compositional ratio p:q:r=50:30:20 (molar ratio).

Synthesis Example 4

15.5 g of ECHMA, 13.6 g of GBLMA, and 9.5 g of ADOHMA were dissolved in 200 ml of tetrahydrofuran (THF), and 1.64 g of azobisisobutyronitrile (AIBN) was then added. Following refluxing for 12 hours, the reaction solution was added dropwise to 2 L of n-heptane. The precipitated resin was then collected by filtration and dried under reduced pressure, yielding a white resin powder. This resin was termed polymer 4 (represented by a general formula (4) shown below). Measurement by GPC revealed a molecular weight (Mw) for the polymer 4 of 12,000, and a polydispersity (Mw/Mn) of 1.8. Furthermore, analysis by carbon-13 nuclear magnetic resonance spectroscopy ($^{13}$C-NMR) revealed a compositional ratio x:y:z=40:40:20 (molar ratio).

Synthesis Example 5

19.4 g of NBtBu, 24.0 g of NBGBL, and 7.5 g of NBCO$_2$H were dissolved in 75 ml of dichloromethane, and a catalyst prepared from 4.3 g of silver borofluoride and 2.0 g of allyl chloride palladium dimer was then added dropwise to the solution. The resulting mixture was then stirred for 24 hours, yielding a crude polymer solution. This polymer solution was purified by conducting reprecipitation in n-heptane twice, and the precipitated resin was then collected by filtration and dried under reduced pressure, yielding a white resin. This resin was termed polymer 5 (represented by a general formula (5) shown below). Measurement by GPC revealed a molecular weight (Mw) for the polymer 5 of 14,000, and a polydispersity (Mw/Mn) of 1.8. Furthermore, analysis by carbon-13 nuclear magnetic resonance spectroscopy ($^{13}$C-NMR) revealed a compositional ratio x:y:z=40:40:20 (molar ratio).

[Formula 28]

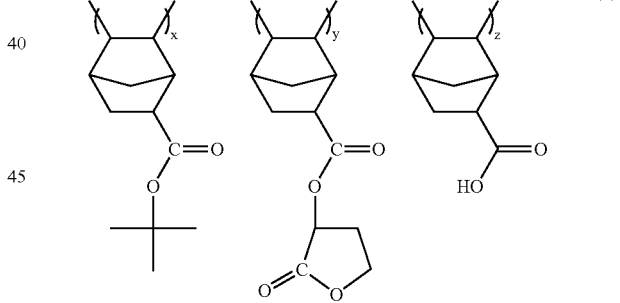

(5)

Synthesis Example 6

25.6 g of NBECH, 21.1 g of NBOH, and 7.5 g of NBCO$_2$H were dissolved in 75 ml of dichloromethane, and a catalyst prepared from 4.3 g of silver borofluoride and 2.0 g of allyl chloride palladium dimer was then added dropwise to the solution. The resulting mixture was then stirred for 24 hours, yielding a crude polymer solution. This polymer solution was purified by conducting reprecipitation in n-heptane twice, and the precipitated resin was then collected by filtration and dried under reduced pressure, yielding a white resin powder. This resin was termed polymer 6 (represented by a general formula (6) shown below). Measurement by GPC revealed a molecular weight (Mw) for the polymer 6 of 13,000, and a polydispersity (Mw/Mn) of 1.8. Furthermore, analysis by carbon-13 nuclear magnetic resonance spectroscopy ($^{13}$C-NMR) revealed a compositional ratio x:y:z=40:40:20 (molar ratio).

[Formula 29]

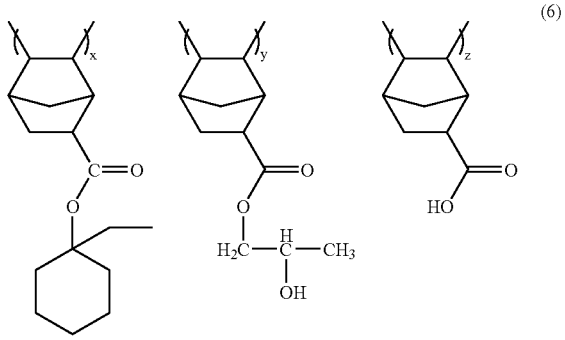

(6)

The composition, molecular weight (Mw), and polydispersity (Mw/Mn) for each of the polymers obtained in Synthesis Examples 1 through 6 are shown in Table 1 below.

The thus obtained resist film was then selectively irradiated with an ArF excimer laser (193 nm) through a mask pattern, using an ArF exposure apparatus NSR-S302 (manufactured by Nikon Corporation; NA (numerical aperture)=0.60, ⅔ annular illumination).

A PEB treatment was then conducted at 100° C. for 90 seconds, and the resist film was subjected to puddle development for 60 seconds at 23° C. in a 2.38% by weight aqueous solution of tetramethylammonium hydroxide (TMAH), and was then washed for 20 seconds with water and dried.

[Evaluation of Shape and Lithography Characteristics]

The exposure time required to form a 130 nm line and space pattern in a 1:1 ratio using the above operation was measured as the sensitivity, in terms of unit of mJ/cm$^2$ (the quantity of energy), and it was found that the quantity of energy was 24 mJ/cm$^2$.

Observation of the cross-sectional shape of this resist pattern using a SEM photograph revealed that a pattern with excellent rectangular formability had been resolved.

Furthermore, the critical resolution was 110 nm.

[Evaluation of Etching Resistance]

Subsequently, a resist film was formed in the same manner as described above, and the etching resistance of that resist

TABLE 1

| | NBECH | NBGBL | NBFOH | NBtBu | NBCO$_2$H | NBOH | ECHMA | GBLMA | ADOHMA | Mw | Mw/Mn |
|---|---|---|---|---|---|---|---|---|---|---|---|
| Synthesis Example 1 | 40 | 40 | 20 | — | — | — | — | — | — | 14,300 | 1.7 |
| Synthesis Example 2 | 50 | 30 | 20 | — | — | — | — | — | — | 13,300 | 1.89 |
| Synthesis Example 3 | 50 | 30 | 20 | — | — | — | — | — | — | 7,000 | 1.8 |
| Synthesis Example 4 | — | — | — | — | — | — | 40 | 40 | 20 | 12,000 | 1.8 |
| Synthesis Example 5 | — | 40 | — | 40 | 20 | — | — | — | — | 14,000 | 1.8 |
| Synthesis Example 6 | 40 | — | — | — | 20 | 40 | — | — | — | 13,000 | 1.8 |

<Evaluation of Positive Resist Compositions According to the Fourth Aspect of the Present Invention>

Example 1

100 parts by weight of the polymer 1 obtained in the synthesis example 1 as the component (A), 3.0 parts by weight of triphenylsulfonium nonafluorobutanesulfonate as the component (B), and 0.35 part by weight of triethanolamine as the component (D) were dissolved in 1,100 parts by weight of a mixed solvent containing propylene glycol monomethyl ether acetate and ethyl lactate in a ratio of 6/4, thereby yielding a positive resist composition according to the fourth aspect of the present invention.

[Evaluation of Resist Film and Resist Pattern]

Subsequently, an organic anti-reflective film composition ARC-29A (a product name, manufactured by Brewer Science Ltd.) was applied to the surface of an 8-inch silicon wafer using a spinner, and the composition was then baked and dried on a hotplate at 215° C. for 60 seconds, thereby forming an organic anti-reflective film with a film thickness of 77 nm.

The positive resist composition prepared above was then applied to the surface of this organic anti-reflective film using a spinner, and was then prebaked (PAB) and dried on a hotplate at 100° C. for 90 seconds, thereby forming a resist film with a film thickness of 250 nm.

film was then evaluated. Namely, using a mixed gas of tetrafluoromethane (CF$_4$), trifluoromethane (CHF$_3$), and helium (flow rate ratio 75:45:150) as the etching gas, and under conditions including a pressure of 0.3 Torr and a temperature of 20° C., a resist film obtained by applying the resist composition to a substrate, conducting a prebake, conducting exposure without using a mask pattern, and then performing PEB (hereafter referred to as the unpatterned resist film) was subjected to a dry etching treatment for 90 seconds at a RF (Ratio Frequency) of 400 kHz and an output of 1,100 W, using an etching apparatus ("TCE-7612X", a brand name, manufactured by Tokyo Ohka Kogyo Co., Ltd.), and measurement of the etching speed of the resist film revealed a result of 8.59 nm/s. The PAB and PEB treatments were conducted under the conditions shown in Table 3 below.

Furthermore, observation of the resist surface with an AFM (Atomic Force Microscope: di Nano Scope IV/D5000, manufactured by Veeco Instruments Inc.) following the dry etching treatment revealed no surface roughness.

The reason why the etching resistance and surface roughness was evaluated with respect to an unpatterned resist film is that it is easier to measure the surface roughness than the case of a patterned resist film.

Examples 2 to 4, Comparative Examples 1 to 3

Positive resist compositions according to the fourth aspect of the present invention and comparative positive resist compositions were prepared using the respective compositions shown in Table 2, and resist patterns were then formed in the same manner as in Example 1, under the conditions shown in Table 3. The results are shown in Table 4.

to the substrate was also excellent. In Example 3, despite the fact that no anti-reflective film undercoat was used, a pattern with extremely good rectangular formability, with no standing waves or the like on the line side walls, was still able to be obtained.

On the other hand, the positive resist composition of Comparative Example 1, which used an acrylic resin, exhibited poor etching resistance. Furthermore, the positive resist com-

TABLE 2

| | (A) Resin | (B) Acid generator | (D) Nitrogen-containing organic compound | Organic solvent |
|---|---|---|---|---|
| Example 1 | Polymer 1 (100 parts by weight) | TPS-PFBS (3.0 parts by weight) | Triethanolamine (0.35 parts by weight) | PGMEA:EL = 6:4 (1100 parts by weight) |
| Example 2 | Polymer 2 (100 parts by weight) | TPS-PFBS (3.0 parts by weight) | Triethanolamine (0.36 parts by weight) | PGMEA:EL = 6:4 (1100 parts by weight) |
| Example 3 | Polymer 2 (100 parts by weight) | TPS-PFBS (3.0 parts by weight) | Triethanolamine (0.37 parts by weight) | PGMEA:EL = 6:4 (1100 parts by weight) |
| Example 4 | Polymer 3 (100 parts by weight) | TPS-PFBS (3.0 parts by weight) | Triethanolamine (0.38 parts by weight) | PGMEA:EL = 6:4 (1100 parts by weight) |
| Comparative Example 1 | Polymer 4 (100 parts by weight) | TPS-PFBS (3.0 parts by weight) | Triethanolamine (0.39 parts by weight) | PGMEA:EL = 6:4 (1100 parts by weight) |
| Comparative Example 2 | Polymer 5 (100 parts by weight) | TPS-PFBS (3.0 parts by weight) | Triethanolamine (0.40 parts by weight) | PGMEA:EL = 6:4 (1100 parts by weight) |
| Comparative Example 3 | Polymer 6 (100 parts by weight) | TPS-PFBS (3.0 parts by weight) | Triethanolamine (0.41 parts by weight) | PGMEA:EL = 6:4 (1100 parts by weight) |

TPS-PFBS: triphenylsulfonium nonafluorobutanesulfonate

TABLE 3

| | Substrate | Anti-reflective film | Resist film thickness | PAB | PEB |
|---|---|---|---|---|---|
| Example 1 | 8-inch silicon | ARC-29A 77 nm | 250 nm | 100° C. 90 seconds | 100° C. 90 seconds |
| Example 2 | 8-inch silicon | ARC-29A 77 nm | 250 nm | 100° C. 90 seconds | 100° C. 90 seconds |
| Example 3 | 8-inch silicon | — | 250 nm | 100° C. 90 seconds | 100° C. 90 seconds |
| Example 4 | 8-inch silicon | ARC-29A 77 nm | 250 nm | 100° C. 90 seconds | 100° C. 90 seconds |
| Comparative Example 1 | 8-inch silicon | ARC-29A 77 nm | 250 nm | 120° C. 90 seconds | 110° C. 90 seconds |
| Comparative Example 2 | 8-inch silicon | ARC-29A 77 nm | 250 nm | 150° C. 90 seconds | 140° C. 90 seconds |
| Comparative Example 3 | 8-inch silicon | ARC-29A 77 nm | 250 nm | 130° C. 90 seconds | 130° C. 90 seconds |

TABLE 4

| | Critical Resolution | Sensitivity | Etching resistance | Surface roughness | Shape |
|---|---|---|---|---|---|
| Example 1 | 110 nm | 24 mJ/cm$^2$ | 8.59 nm/s | Good | Rectangular |
| Example 2 | 110 nm | 24 mJ/cm$^2$ | 8.09 nm/s | Good | Rectangular |
| Example 3 | 120 nm | 20 mJ/cm$^2$ | 8.59 nm/s | Good | Rectangular |
| Example 4 | 110 nm | 26 mJ/cm$^2$ | 8.63 nm/s | Good | Rectangular |
| Comparative Example 1 | 110 nm | 25 mJ/cm$^2$ | 14.25 nm/s | Very poor | Rounded top Undercut |
| Comparative Example 2 | 160 nm | 15 mJ/cm$^2$ | 10.35 nm/s | Good | Rounded top Tapered |
| Comparative Example 3 | 160 nm | 18 mJ/cm$^2$ | 7.95 nm/s | Good | Rounded top Tapered |

From the above results, it is evident that the resist patterns obtained using the positive resist compositions of the Examples 1 through 4 exhibited excellent resolution, as well as excellent etching resistance. Furthermore, there was no pattern collapse, indicating that the adhesion of the resist film positions of Comparative Examples 2 and 3, which used resins that lacked one of either the structural unit (a1) or the structural unit (a2), exhibited low resolution. Furthermore, pattern collapse also occurred.

Evaluation of Positive Resist Compositions according to the Fifth Aspect of the Present Invention Example 5

A mixture of 25 parts by weight of the polymer 1 obtained in Synthesis Example 1 and 75 parts by weight of the polymer 4 obtained in Synthesis Example 4 as the component (A), 2.0 parts by weight of diphenyl(4-methylphenyl)sulfonium nonafluorobutanesulfonate and 0.8 part by weight of tri(4-tert-butylphenyl)sulfonium nonafluorobutanesulfonate as the component (B), and 0.25 part by weight of triethanolamine as the component (D) was dissolved in 25 parts by weight of γ-butyrolactone and 1,100 parts by weight of a mixed solvent containing propylene glycol monomethyl ether acetate and ethyl lactate in a ratio of 6/4, thereby yielding a positive resist composition according to the fifth aspect of the present invention.

Example 6

With the exception of using 50 parts by weight of the polymer 1 and 50 parts by weight of the polymer 4 as the component (A), a positive resist composition of the fifth aspect of the present invention was prepared in the same manner as in Example 5.

Comparative Example 4

With the exception of using 100 parts by weight of the polymer 4 as the component (A), a positive resist composition was prepared in the same manner as in Example 5.

Using the positive resist compositions prepared in Examples 5 and 6 and Comparative Example 4, resist films and resist patterns were formed, and the shape and lithography characteristics, together with the etching resistance, were then evaluated.

The method used for forming the resist films and resist patterns employed substantially the same method as that used in Example 1, with the exception of altering the time of the puddle development to 30 seconds.

[Evaluation of Shape and Lithography Characteristics]
—Line and Space Pattern Example The exposure dose Eop required to form a line and space (L/S) pattern with a line width of 120 nm was measured in units of $mJ/cm^2$ (the quantity of energy), and it was found that the result was 19 $mJ/cm^2$ for Example 5, 20 $mJ/cm^2$ for Example 6, and 19 $mJ/cm^2$ for Comparative Example 4.

Furthermore, observation of the cross-sectional shape of these resist patterns using a SEM photograph revealed that for each of the positive resist compositions, a L/S pattern with a high degree of perpendicularity in the pattern side walls, excellent surface smoothness, and excellent rectangular formability had been able to be resolved.

Furthermore, the critical resolution for a L/S pattern when exposure was conducted using the exposure dose Eop described above was 110 nm in each case.

Furthermore, using the exposure dose Eop described above, resist pattern formation was conducted in the same manner as above, but with the depth of focus offset up or down, and the depth of focus range for which a 120 nm L/S pattern could be formed within a dimensional variation of ±10% (namely, from 132 nm to 108 nm) was determined. The results revealed that the depth of focus was similar for Examples 5 and 6, and Comparative Example 4.

Furthermore, the exposure margin for forming a 120 nm L/S pattern within an error of ±10% was 10.2% for Example 5, 9.8% for Example 6, and 9.1% for Comparative Example 4.

—Isolated Space Pattern (Trench Pattern) Example

The exposure dose Eop' required to form an isolated space pattern with a space width of 130 nm (and a pitch of 1,430 nm) was measured in units of $mJ/cm^2$ (the quantity of energy) in a similar manner to that described above, and it was found that the result was 26 $mJ/cm^2$ for Example 5, 27 $mJ/cm^2$ for Example 6, and 29 $mJ/cm^2$ for Comparative Example 4.

Furthermore, observation of the cross-sectional shape of these resist patterns using a SEM photograph revealed that for each of the positive resist compositions, an isolated space pattern with a high degree of perpendicularity in the pattern side walls, excellent surface smoothness, and excellent rectangular formability had been able to be resolved.

Furthermore, the critical resolution for an isolated space pattern when exposure was conducted using the exposure dose Eop' described above was 110 nm in each case.

Furthermore, using the exposure dose Eop' described above, isolated space pattern (pitch: 2,200 nm) formation was conducted in the same manner as above, and the MEF value at 140 nm to 130 nm was determined in the same manner as described above. The results revealed MEF (200 nm to 130 nm) values of 1.47 for Example 5, 1.48 for Example 6, and 1.48 for Comparative Example 4, which represent substantially equal results.

Furthermore, the depth of focus for a 130 nm isolated space pattern formed at the above exposure dose Eop' was substantially equal for Examples 5 and 6, and Comparative Example 4.

[Evaluation of Etching Resistance]

Resist films were formed in the same manner as described above, and the etching resistance of those resist films was evaluated. The etching method employed was the same as the method described for Example 1. Observation of the resist surfaces with an AFM following the dry etching treatment revealed highly smooth surfaces with no surface roughness for Examples 5 and 6. In contrast, Comparative Example 4 displayed significant surface roughness.

From the above results it is evident that the resist patterns obtained using the positive resist compositions of Examples 5 and 6 exhibited a high degree of etching resistance and displayed no surface roughness. Furthermore, the shape of these resist patterns also exhibited excellent rectangular formability. The positive resist composition of Example 5 yielded particularly favorable results, with a good balance across all properties. Furthermore, the lithography characteristics such as the resolution, linearity, depth of focus, and exposure margin and the like were substantially equal to those of Comparative Example 4, and the linearity for an isolated space pattern and the exposure margin for a line and space pattern were actually superior to the results observed for Comparative Example 4.

On the other hand, although the resist pattern obtained using the positive resist composition of Comparative Example 4 displayed excellent shape and superior lithography characteristics, the etching resistance was extremely poor.

INDUSTRIAL APPLICABILITY

As described above, a polymer, a positive resist composition, and a method for forming a resist pattern according to the present invention are capable of forming a resist pattern with a high level of resolution and excellent etching resistance, and are consequently very useful industrially.

The invention claimed is:
1. A positive resist composition, comprising a resin (A), which contains acid-dissociable, dissolution-inhibiting groups and exhibits increased alkali solubility under action of acid, and a compound (B) that generates acid on irradiation,
wherein said resin (A') is a mixture of a cyclic group-containing principal chain polymer (A'1), and a polymer (A'2) comprising solely structural units (a') derived from a (meth)acrylate ester and/or (meth)acrylic acid,
wherein said cyclic group-containing principal chain polymer (A'1) comprises a structural unit (a1) represented by a general formula (a-1) shown below, a structural unit (a2) represented by a general formula (a-2) shown below, and a structural unit (a3) represented by a general formula (a-3) shown below,
wherein said polymer (A'2) comprises a structural unit (a'1) derived from a (meth)acrylate ester containing an acid-dissociable, dissolution-inhibiting group, a struc- tural unit (a'2) derived from a (meth)acrylate ester containing a lactone ring, and a structural unit (a'3) derived from a (meth)acrylate ester containing a polar group-containing aliphatic hydrocarbon group:

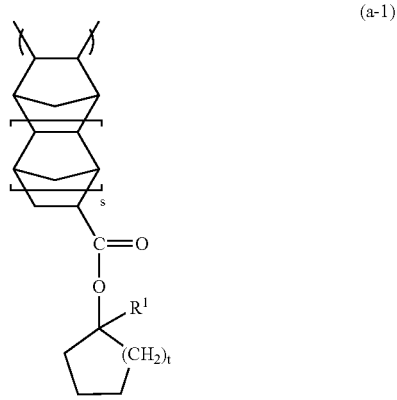
(a-1)

[wherein in said formula (a-1), $R^1$ represents an alkyl group of two or more carbon atoms, s represents either 0 or 1, and t represents an integer from 1 to 3],

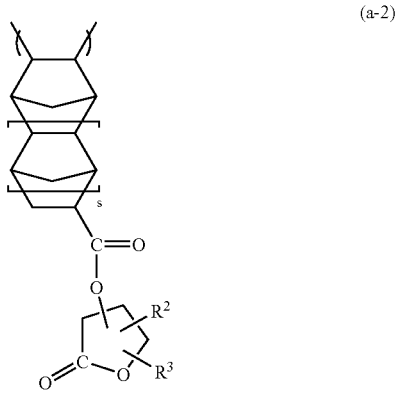
(a-2)

[wherein in said formula (a-2), $R^2$ and $R^3$ each represent, independently, a hydrogen atom or a lower alkyl group, and s represents either 0 or 1], and

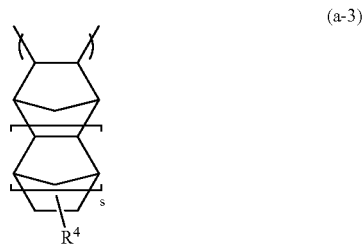
(a-3)

[wherein in said formula (a-3), $R^4$ represents an organic group containing an alkali-soluble group, and s represents either 0 or 1].

2. A positive resist composition according to claim 1, wherein said polymers (A'1) and (A'2) contain acid-dissociable, dissolution-inhibiting groups with identical structures.

3. A positive resist composition according to claim 1, wherein said polymers (A'1) and (A'2) contain lactone rings with identical structures.

4. A positive resist composition according to claim 1, wherein $R^1$ in said formula (a-1) represents an ethyl group, and t represents 2.

5. A positive resist composition according to claim 1, wherein $R^4$ in said general formula (a-3) is a hydroxyalkyl group of 3 to 15 carbon atoms in which at least one hydrogen atom has been substituted with a fluorine atom, or a carboxyl group.

6. A positive resist composition according to claim 5, wherein $R^4$ in said general formula (a-3) is a group represented by a general formula (a-4) shown below:

[Formula 14]

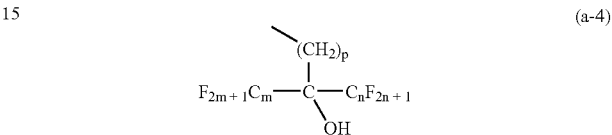
(a-4)

[wherein in said formula (a-4), p represents an integer from 1 to 5, and m and n each represent, independently, an integer from 1 to 5].

7. A positive resist composition according to claim 1, wherein said structural unit (a'1) is a structural unit represented by a general formula (a-5) shown below:

[Formula 15]

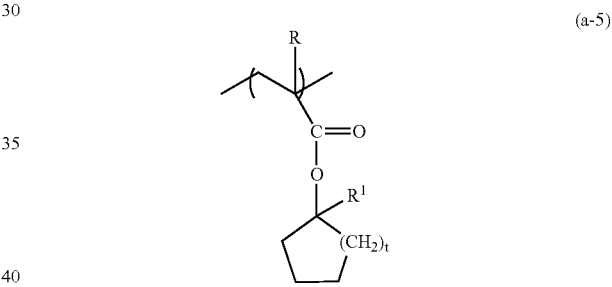
(a-5)

[wherein in said formula (a-5), R represents a hydrogen atom or a methyl group, $R^1$ represents an alkyl group of two or more carbon atoms, and t represents an integer from 1 to 3].

8. A positive resist composition according to claim 7, wherein said structural unit (a'2) is a structural unit represented by a general formula (a-6) shown below:

[Formula 16]

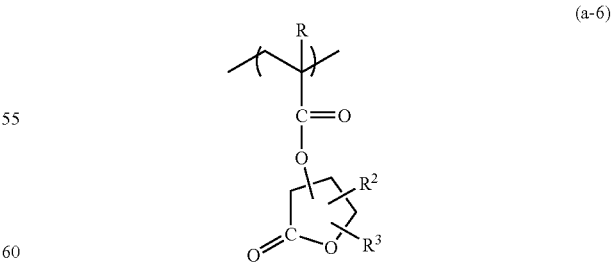
(a-6)

[wherein in said formula (a-6), R represents a hydrogen atom or a methyl group, and $R^2$ and $R^3$ each represent, independently, a hydrogen atom or a lower alkyl group].

9. A positive resist composition according to claim 8, wherein said structural unit (a'3) is a structural unit represented by a general formula (VII) shown below:

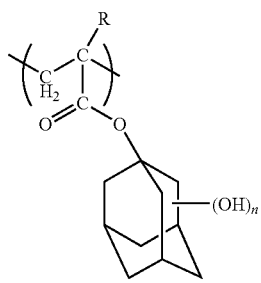

(wherein, R represents a hydrogen atom or a methyl group, and n represents an integer from 1 to 3).

10. A positive resist composition according to claim 1, wherein said structural unit (a'2) is a structural unit represented by a general formula (a-6) shown below:

[Formula 16]

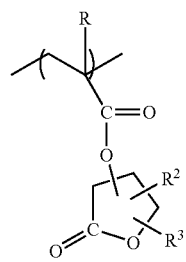

[wherein in said formula (a-6), R represents a hydrogen atom or a methyl group, and $R^2$ and $R^3$ each represent, independently, a hydrogen atom or a lower alkyl group].

11. A positive resist composition according to claim 1, wherein a weight ratio between said cyclic group-containing principal chain polymer (A'1) and said polymer (A'2) is within a range of from 1:9 to 9:1.

12. A positive resist composition according to claim 1, wherein said resin (A') is a mixture of a polymer (A11) represented by a general formula (a-11) shown below, and a polymer (A21) represented by a general formula (a-21) shown below:

[Formula 17]

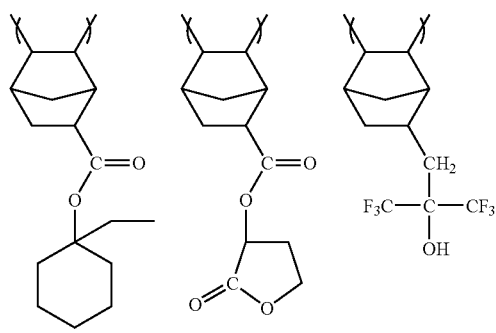

[Formula 18]

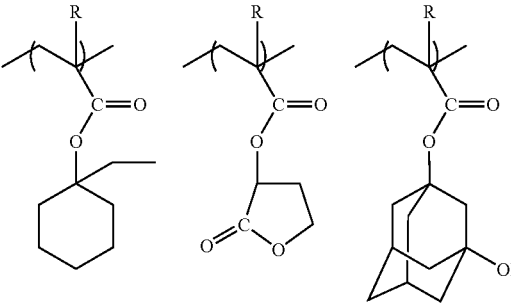

[wherein in said formula (a-21), R represents a hydrogen atom or a methyl group].

13. A positive resist composition according to claim 1, wherein said compound (B) that generates acid on irradiation is an onium salt with a fluorinated alkylsulfonate ion as an anion.

14. A positive resist composition according to claim 1, further comprising a nitrogen-containing organic compound.

15. A method for forming a resist pattern, comprising the steps of applying a positive resist composition according to claim 1 to a support, conducting selective exposure, and subsequently conducting alkali developing to form a resist pattern.

16. A positive resist composition according to claim 1, wherein said structural unit (a'3) is a structural unit represented by a general formula (VII) shown below:

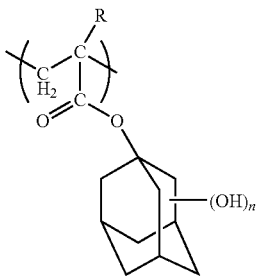

(wherein, R represents a hydrogen atom or a methyl group, and n represents an integer from 1 to 3).

* * * * *